United States Patent  
Conn

(10) Patent No.: US 6,864,142 B1
(45) Date of Patent: Mar. 8, 2005

(54) METHOD TO PRODUCE A FACTORY PROGRAMMABLE IC USING STANDARD IC WAFERS AND THE STRUCTURE

(75) Inventor: Robert O. Conn, Los Gatos, CA (US)

(73) Assignee: XILINX, Inc., San Jose, CA (US)

(*) Notice: Subject to any disclaimer, the term of this patent is extended or adjusted under 35 U.S.C. 154(b) by 30 days.

(21) Appl. No.: 10/079,235

(22) Filed: Feb. 19, 2002

(51) Int. Cl.[7] .................. H01L 21/336; H01L 21/8236; H01L 21/30; H01L 21/326

(52) U.S. Cl. ...................... 438/293; 438/278; 438/281; 438/308; 438/459; 438/470

(58) Field of Search .................. 438/459, 455–458, 438/262, 278, 281, 293, 308, 470

(56) References Cited

U.S. PATENT DOCUMENTS

| | | | | |
|---|---|---|---|---|
| 5,071,785 A | * | 12/1991 | Nakazato et al. | 438/457 |
| 5,252,502 A | * | 10/1993 | Havemann | 438/151 |
| 5,256,562 A | * | 10/1993 | Vu et al. | 438/28 |
| 5,318,869 A | * | 6/1994 | Hashimoto et al. | 430/5 |
| 5,609,780 A | * | 3/1997 | Freedenberg et al. | 219/121.73 |
| 6,337,504 B1 | * | 1/2002 | Isobe et al. | 257/384 |

FOREIGN PATENT DOCUMENTS

JP 04226039 A * 8/1992 .......... H01L/21/336

* cited by examiner

Primary Examiner—Shouxiang Hu
(74) Attorney, Agent, or Firm—Jeanette S. Harms; Edel M. Young; Justin Liu

(57) ABSTRACT

A method for programming a semiconductor element in a semiconductor structure such as an IC involves reducing the backside thickness of the substrate and directing an energy beam through the backside at an opaque component of the semiconductor element. A support structure mounted on the semiconductor structure provides support during and after the thinning operation. Alternatively, the substrate can be thinned only under the semiconductor element, leaving the rest of the substrate thick enough to maintain structural integrity. The energy beam heats the opaque component. The prior thinning operation minimizes heat dissipation away from the semiconductor element, so that dopant diffusion occurs, changing the electrical characteristics of the semiconductor element. By modifying selected elements in this manner, a semiconductor structure can be permanently programmed, even if it does not include non-volatile memory. Additionally, security is enhanced since the programming leaves no visible signs.

23 Claims, 24 Drawing Sheets

US 6,864,142 B1

METHOD TO PRODUCE A FACTORY PROGRAMMABLE IC USING STANDARD IC WAFERS AND THE STRUCTURE

FIELD OF THE INVENTION

The present invention relates to integrated circuits, and in particular to a method for permanently modifying transistors using a laser.

BACKGROUND OF THE INVENTION

It is often desirable to be able to factory program integrated circuits (ICs), i.e. introduce permanent changes into the ICs at the fab, for example, to create an ID tag or provide an encryption key. However, many ICs do not include non-volatile memory in which such permanent configurations could be stored. For example, high-density field programmable gate arrays (FPGAs) are typically produced using static random access memory (SRAM) technology, which provides a large degree of user flexibility but is not conducive to storing permanent device configuration data. And even when non-volatile memory is available, it can be useful to have available alternative means of programming that do not consume those non-volatile memory resources. Accordingly, it is desirable to provide a method for factory programming an IC without using nonvolatile memory.

SUMMARY OF THE INVENTION

The present invention provides a method for altering the semiconducting properties of a semiconductor element via localized heating. By directing an energy beam (such as a laser beam) at selected semiconductor elements (such as transistors, diodes, resistors, etc.) in a semiconductor structure (such as an IC), the electrical behavior of those elements can be changed, thereby programming the semiconductor structure.

For example, according to an embodiment of the present invention, an IC can be factory programmed by attaching a support structure to the front of a processed wafer, performing a thinning operation on the wafer backside, and then directing a laser through the wafer backside at selected transistors formed on the wafer front. Note that backside access would typically be used because of the intervening metal layers on the front of the wafer. The laser is configured to produce a laser beam that is transmitted through the wafer material and absorbed by material used in the transistors that is opaque to the laser beam. Therefore, when the laser is directed at a particular transistor, the local area of that transistor is heated. According to an embodiment of the invention, the metal or silicide gate of a transistor provides the localized heating as it absorbs the laser energy. According to another embodiment of the invention, the metal silicide layers in a metal salicide transistor can provide heating at both the gate and source/drain regions. According to another embodiment of the invention, the laser is directed through the backside to the metal contact pad(s) of a bipolar transistor.

Because of the reduced thickness of the wafer, thermal conduction away from the immediate vicinity of the heated gate (and source/drain for salicide or base/emitter/collector for bipolar) is minimized. The difference in thermal conductivity between metal and silicon or silicon dioxide is small. The thinning is to minimize heat flow into the bulk of the wafer. In addition, it keeps the heat localized so it doesn't affect nearby transistors. The resulting concentrated heating causes diffusion of the dopant atoms in the source (emitter), drain (collector), and channel (base) regions of the element. Eventually, the source (emitter) and drain (collector) regions of the element merge, placing the element in a permanently "on" (i.e. programmed) configuration. An additional benefit of this methodology is that no visible indication of programming is created, enhancing the security of the programmed data.

The support structure can comprise any material capable of providing structural reinforcement of the semiconductor structure during and after the thinning operation, such as an unprocessed wafer, a processed wafer, or even a plastic or metal plate. Likewise, any mounting method can be used to attach the support structure to the top surface of the wafer, so long as the mounting method does not damage the elements formed on the wafer. Such methods can include the use of epoxy adhesives or covalent bonding. The thinning operation itself can be performed using any backside thinning technique, including grinding, chemical-mechanical polishing (CMP), and etching. The final thickness of the processed wafer is selected to minimize heat transfer away from the immediate vicinity of the element during programming, without overly degrading the structural integrity of the wafer or damaging the elements formed on the wafer surface.

As noted previously, the support structure is intended to reinforce the wafer during and after the thinning operation. Such reinforcement will typically be required for a bulk thinning process, such as grinding, CMP, or non-masked etch. Such bulk processes can reduce the thickness of the entire substrate, thereby substantially weakening the wafer and creating a need for supplementary reinforcement. However, according to another embodiment of the present invention, a localized etch process thins the wafer backside only at the locations of interest for programming purposes (i.e. under the transistors being made available for programming). By removing material from only a small portion of the wafer, the need for structural reinforcement is eliminated. A laser can then be used to program the desired elements as described previously, with the local thickness reductions minimizing heat transfer away from the source, drain, and channel regions during programming.

DETAILED DESCRIPTION

Figure 1A:
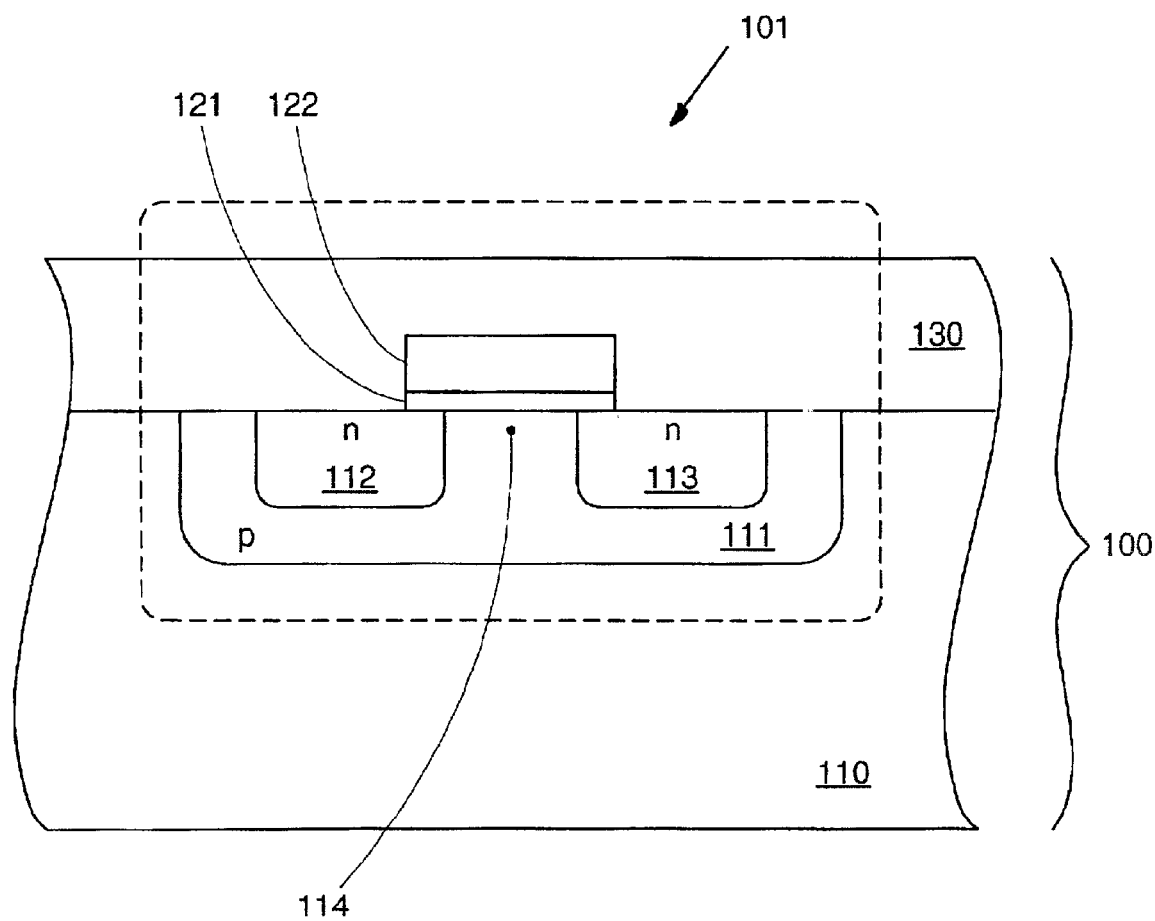
FIGS. 1a–1e show a process for programming a semiconductor element using an energy beam in accordance with an embodiment of the present invention.

FIG. 1a shows a semiconductor element 101 formed as part of a processed semiconductor structure 100. Processed semiconductor structure 100 can comprise any type of semiconductor structure (e.g., FPGA wafers, memory wafers, etc.) formed using any type of semiconductor process (e.g., MOSFET, bipolar, etc.) and semiconductor technology (e.g., silicon, gallium arsenide, etc.).

Semiconductor element 101 comprises a metal-oxide-semiconductor (MOS) transistor located in a p-well 111 formed in a semiconductor substrate 110. Semiconductor substrate, 110 can comprise any support structure on which semiconductor elements can be formed, such as a silicon wafer, a glass or other insulating plate, or even a multi-layer structure such as an amorphous silicon layer formed on a metal sheet. Semiconductor element 101 comprises an n-type source 112 and an n-type drain 113, which are formed in p-well 111 and define a channel region 114. Semiconductor element 101 further comprises a gate oxide 121 over channel region 114, and a metal or polysilicon gate 122 formed on gate oxide 121. A passivation layer 130 covers semiconductor element 101 to provide environmental protection. Note that while semiconductor element 101 is depicted as a conventional MOS transistor for explanatory purposes, semiconductor element 101 could comprise any type of semiconductor element.

Figure 1B:
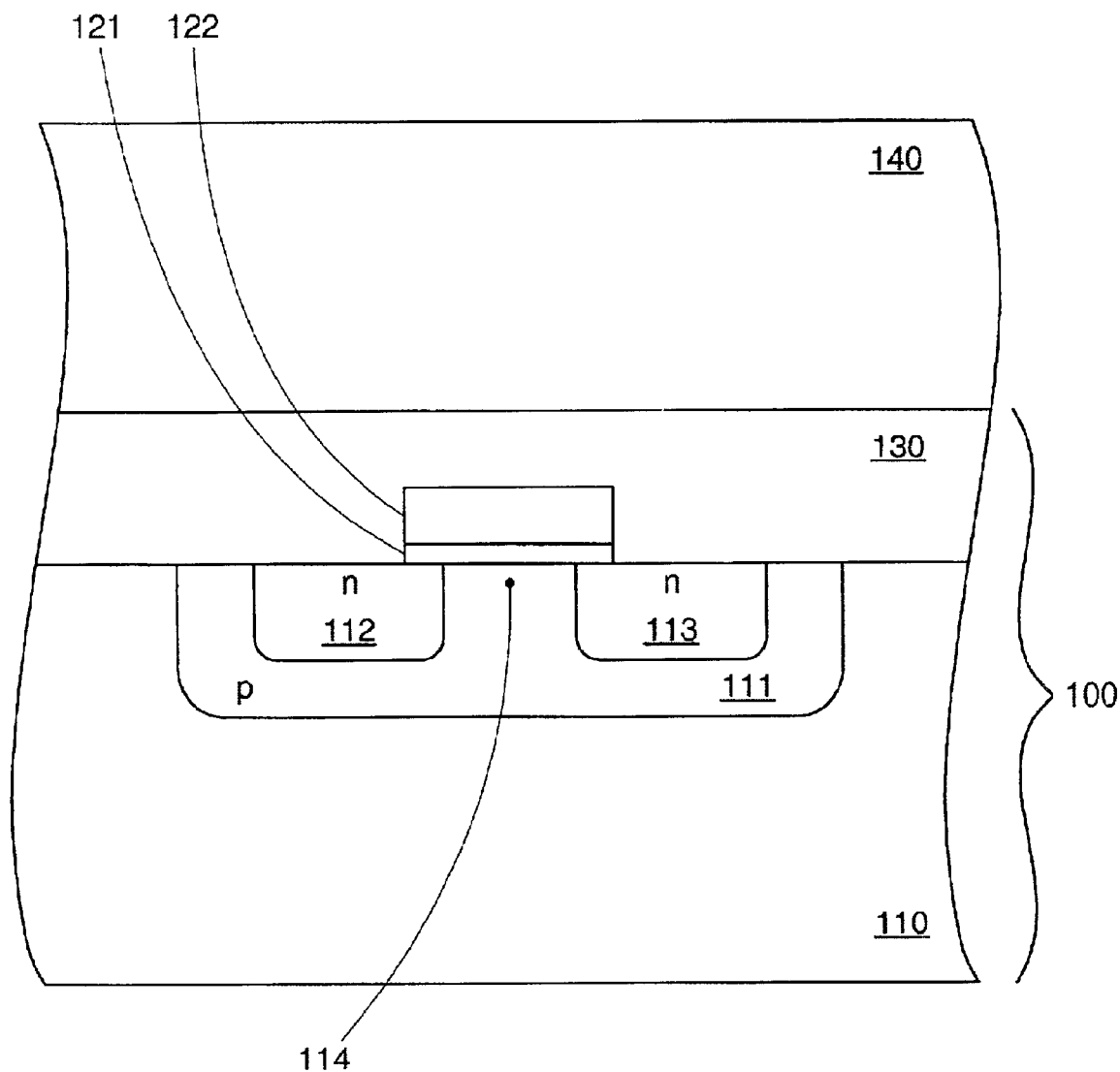

To program semiconductor element 101 in accordance with an embodiment of the present invention, a support structure 140 is mounted on the top surface of semiconductor structure 100, as shown in FIG. 1b. Support structure 140 can comprise any substantially rigid material, and can be attached to the IC in any manner that does not damage the elements formed on the front of semiconductor structure 100. For example, support structure 140 can comprise an unprocessed wafer having an oxide surface covalently bonded to passivation layer 130. Various techniques exist for covalently bonding support structure 140 to semiconductor structure 100. For example, the contacting surfaces of both support structure 140 and semiconductor structure 100 could be polished to a flatness within 1 atom thickness in a non-oxidizing environment. The surfaces can then be simply pressed together to form a covalent bond. Alternatively, support structure 140 can comprise a plastic or metal plate epoxied to passivation layer 130. Note that bonding with epoxy will minimize the thermal resistance to the support structure. This may help the programming but will inhibit the heat removal of the device in normal operation. Various other materials and attachment mechanisms will be apparent to one of ordinary skill in the art.

Figure 1C:
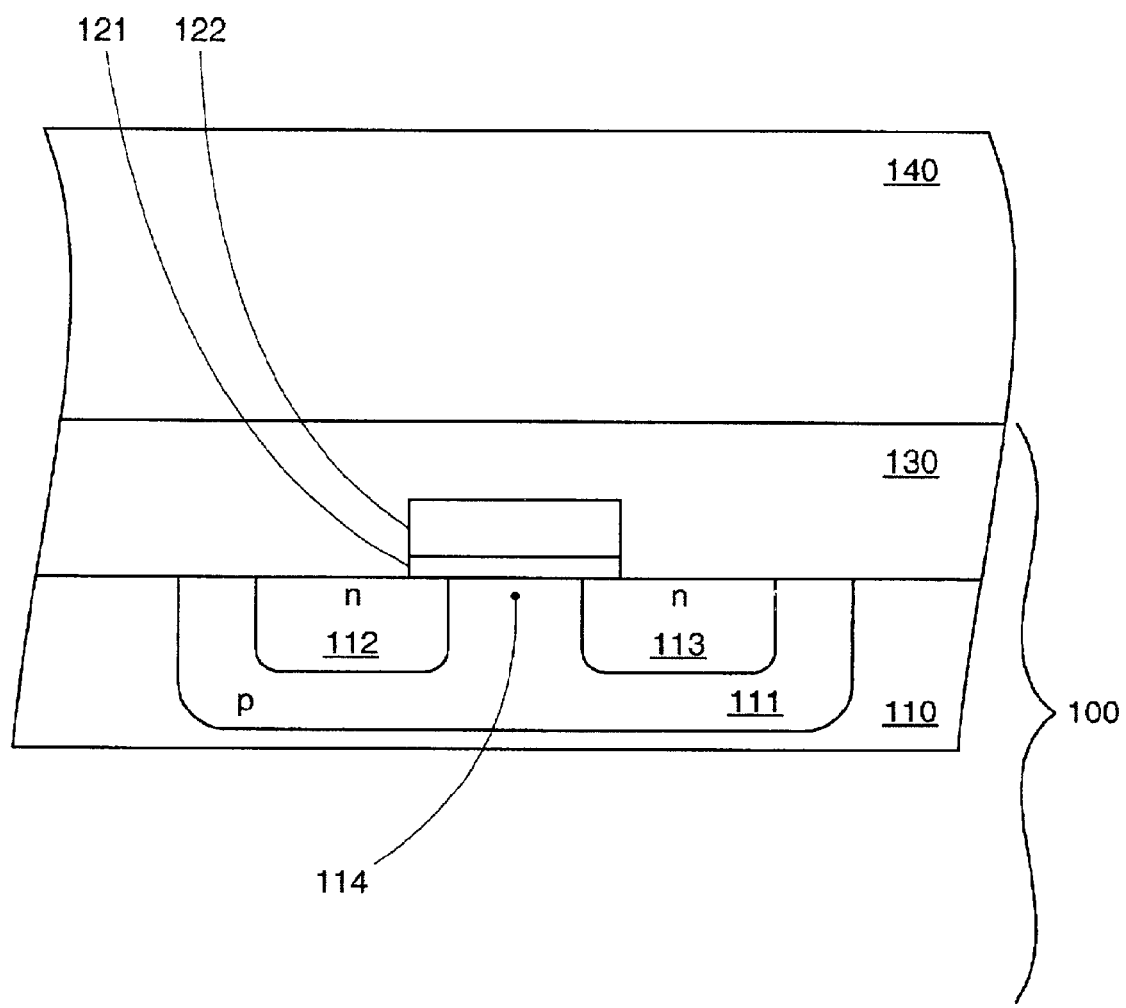

Once support structure 140 is mounted, a bulk thinning operation is performed on the backside of semiconductor structure 100, as shown in FIG. 1c. Support structure 140 supports and stabilizes semiconductor structure 100 during (and after) this operation. The bulk thinning process can be performed by various methods, including grinding, chemical mechanical polishing (CMP), or etching.

Figure 1D:
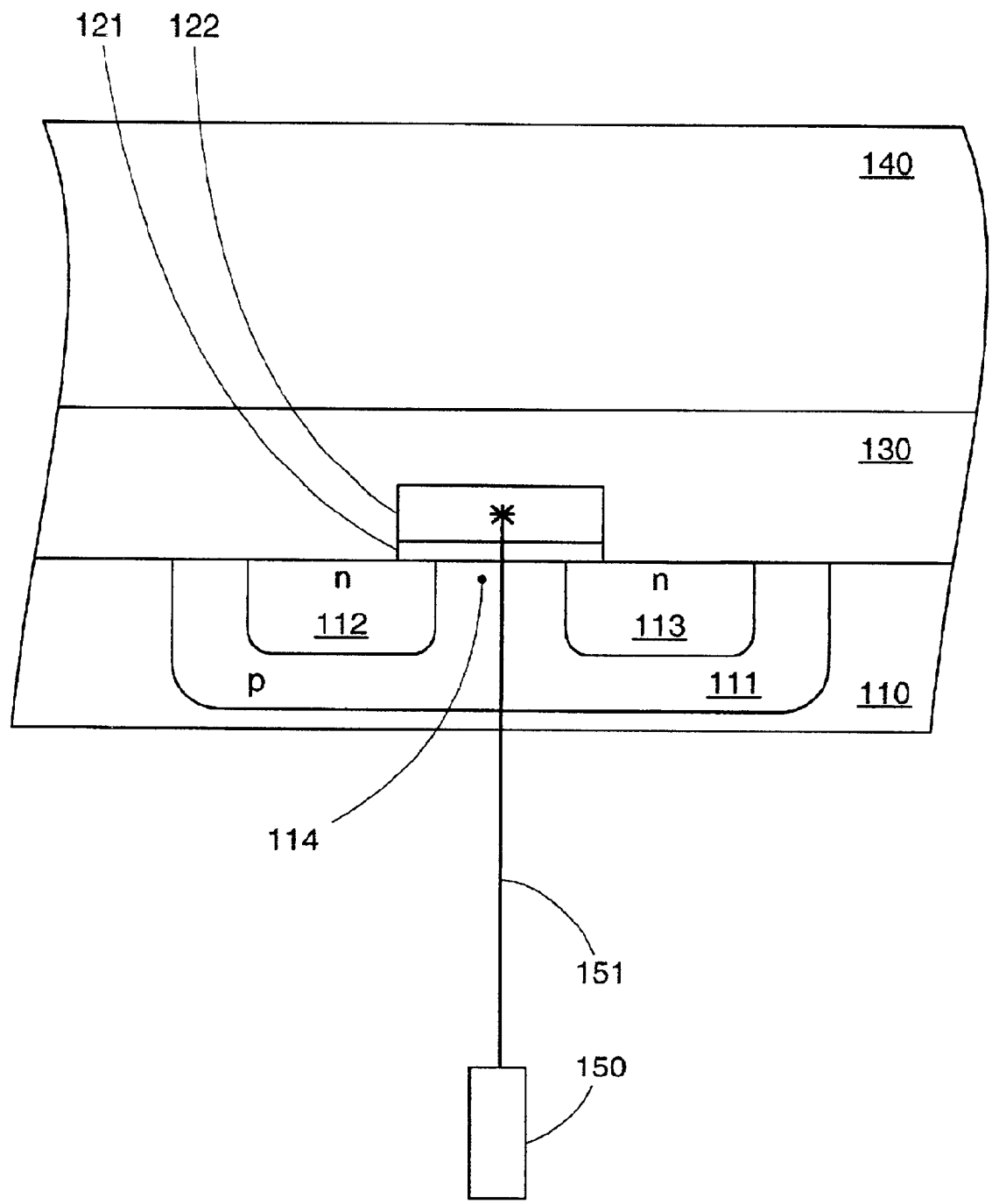

An energy source 150 then directs an energy beam 151 at metal gate 122 through thinned substrate 110 and gate oxide 121, as shown in FIG. 1d. Energy beam 151 is configured such that metal gate 122 will be substantially opaque to the beam, while substrate 110 and gate oxide 121 will be substantially transparent. According to an embodiment of the present invention, energy source 150 comprises a $CO_2$, or YAG laser of the type used in optical lithography process steps and having a wavelength greater than 1.2 $\mu$m. According to another embodiment of the present invention, energy source 150 comprises a laser ablation system of the type used to repair defects in photomasks.

Figure 1E:
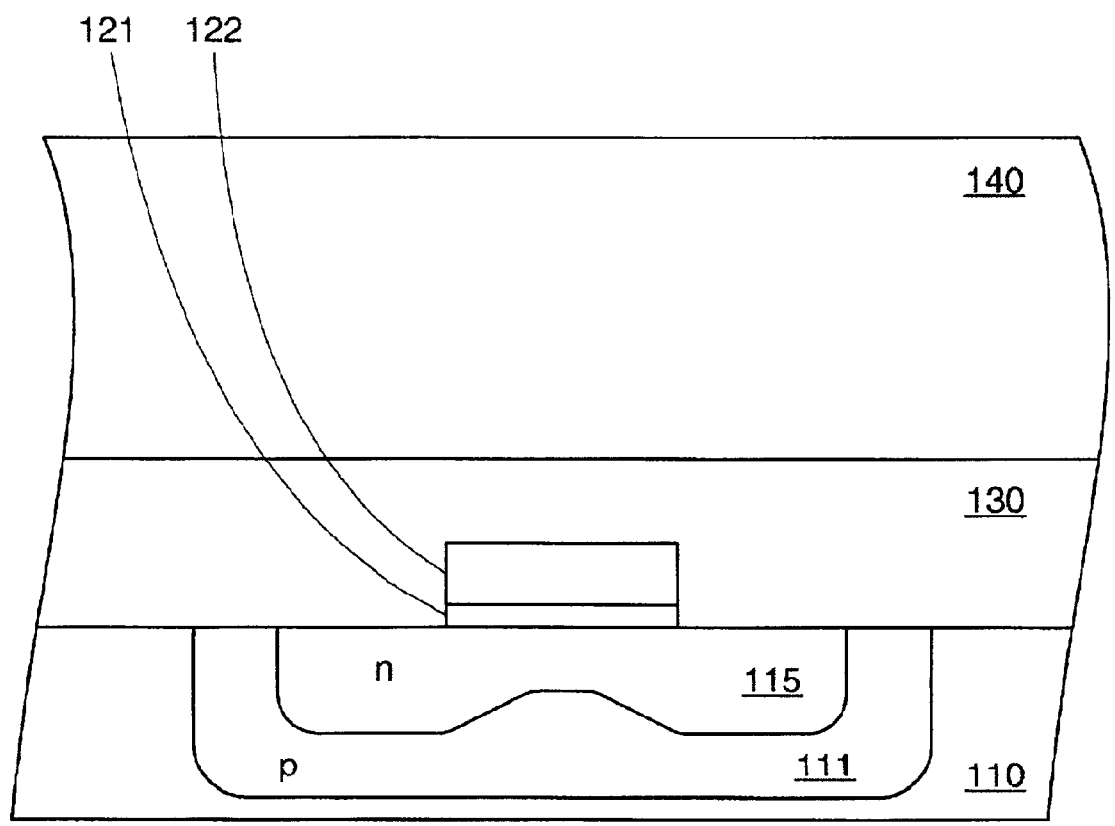

Energy beam 151 therefore passes relatively unaffected through substrate 110 and gate oxide 121, and is absorbed by metal gate 122. Metal gate 122 then heats up as it absorbs the energy from energy beam 151. Because wafer materials such as silicon have good thermal conductivity, heat generated at metal gate 122 would typically be rapidly dissipated by substrate 110. However, due to the reduced thickness of substrate 110, the rate of heat transfer between metal gate 122 and channel region 114 is substantially greater than rate of heat transfer away from those regions via substrate 110. Therefore, the thermal energy from metal gate 122 accumulates in channel region 114 and the surrounding portions of source 112 and drain 113. For example, in a 0.18-micron process, semiconductor structure 100 can be thinned until its backside surface is roughly 1 micron from p-well 111. A 100 ns burst of laser energy can raise metal gate 122 to a temperature of 1100–1200° C., and because of the reduced thickness of substrate 110, this thermal energy goes mainly into heating of channel region 114 and the surrounding portions of source 112 and drain 113. At these high temperatures, diffusion of the dopant atoms in those regions begins to occur, and eventually n-type source 112 and n-type drain 113 merge into a single n-type region 115, as shown in FIG. 1e. N-type region 115 provides an "always on" current path, effectively shorting out (i.e. programming) the transistor. By modifying selected transistors in an IC in this manner, a permanent configuration can be programmed into the IC, even if the IC does not include nonvolatile memory.

Figure 2A:
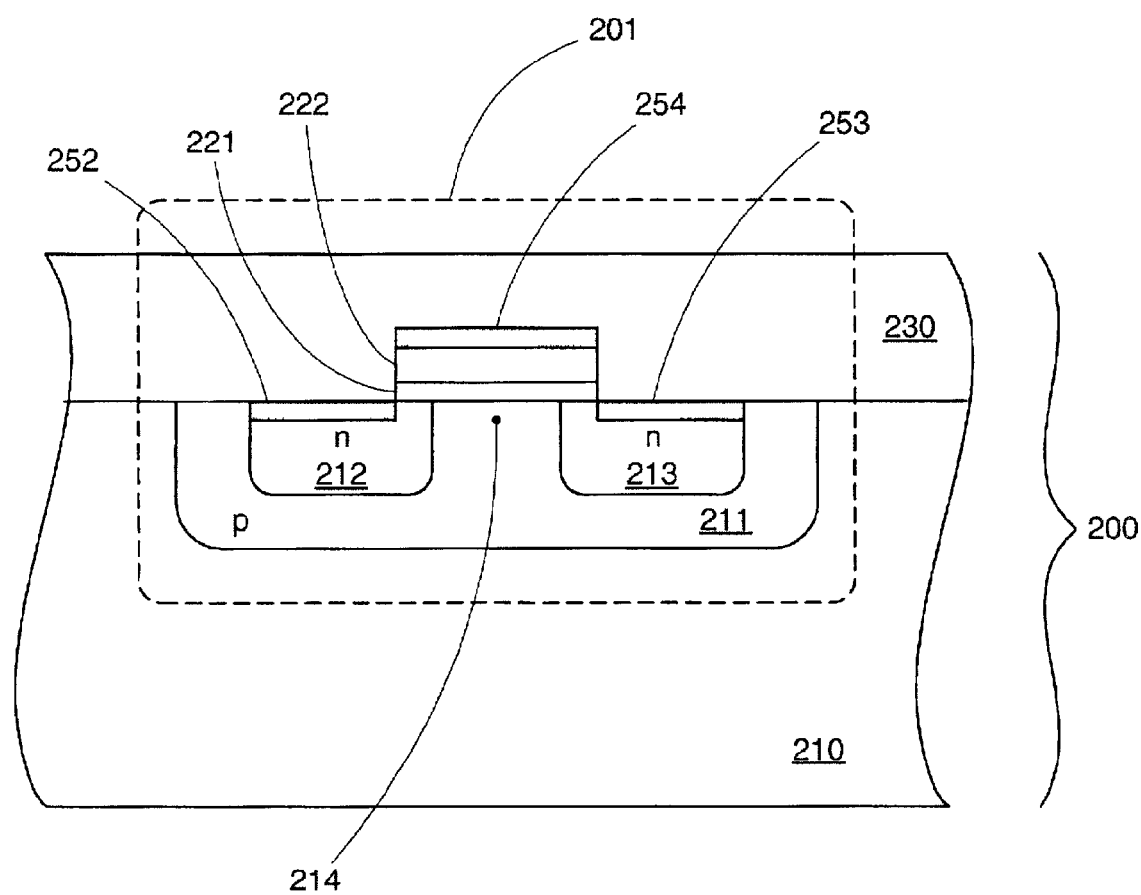
FIGS. 2a–2e show a process for programming a metal salicide transistor using a laser beam in accordance with an embodiment of the present invention.

According to another embodiment of the invention, enhanced laser heating can be achieved through the use of metal salicide transistors. FIG. 2a shows a conventional metal salicide transistor 201 formed as part of a semiconductor structure 200. Transistor 201 is located in a p-well 211 formed in a silicon substrate 210. Transistor 201 comprises an n-type source 212 and an n-type drain 213, which are formed in p-well 211 and define a channel region 214. Transistor 201 further comprises a gate oxide 221 over channel region 214, and a polysilicon layer 222 formed on gate oxide 121. Transistor 201 further comprises metal silicide layers 252, 253, and 254 formed over source 212, drain 213, and polysilicon layer 222, respectively. Metal silicide layers 252, 253, and 254 can comprise titanium silicide (TiSi), tungsten silicide (WSi), or any other metal silicide formation, and are formed using a self-aligning process (salicide process). A passivation layer 230 covers transistor 201 to provide environmental protection.

Figure 2B:
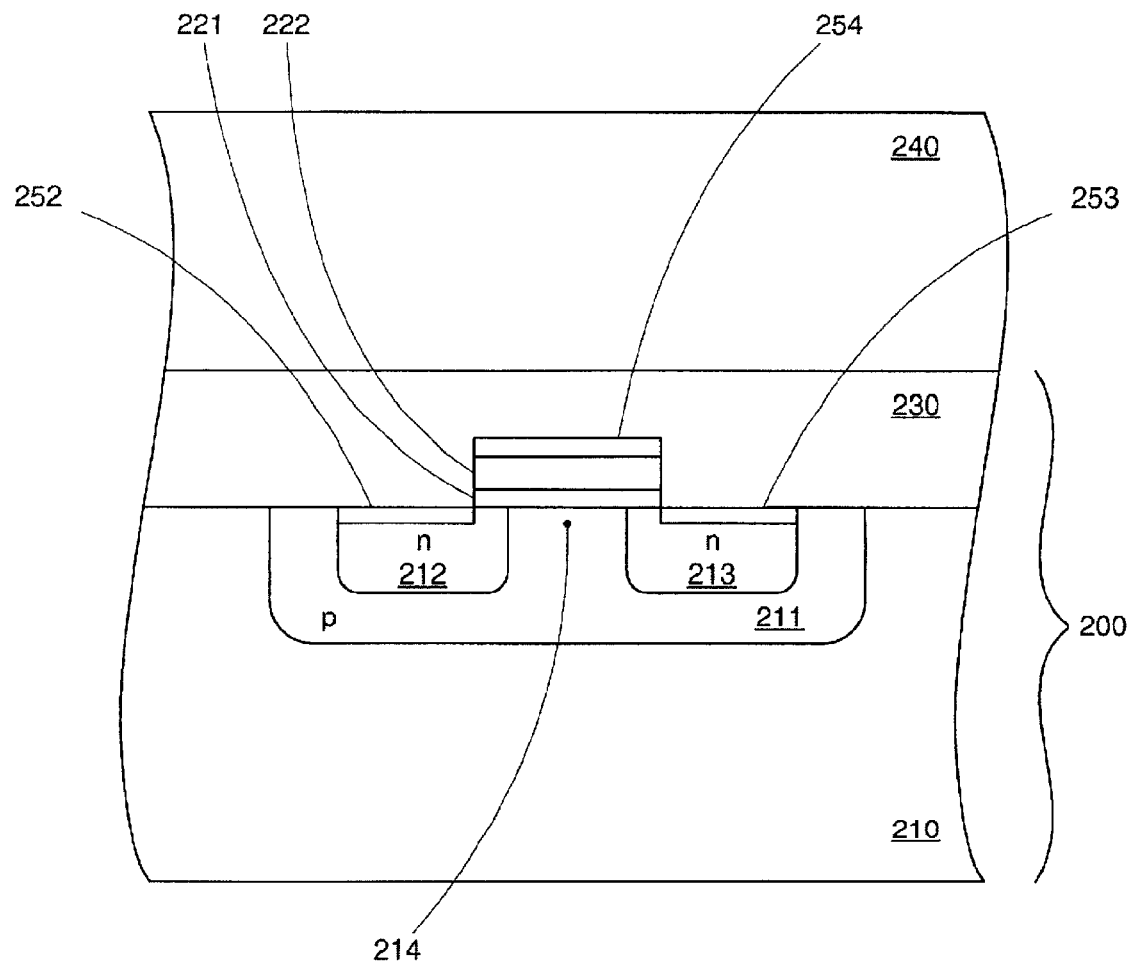
Figure 2C:
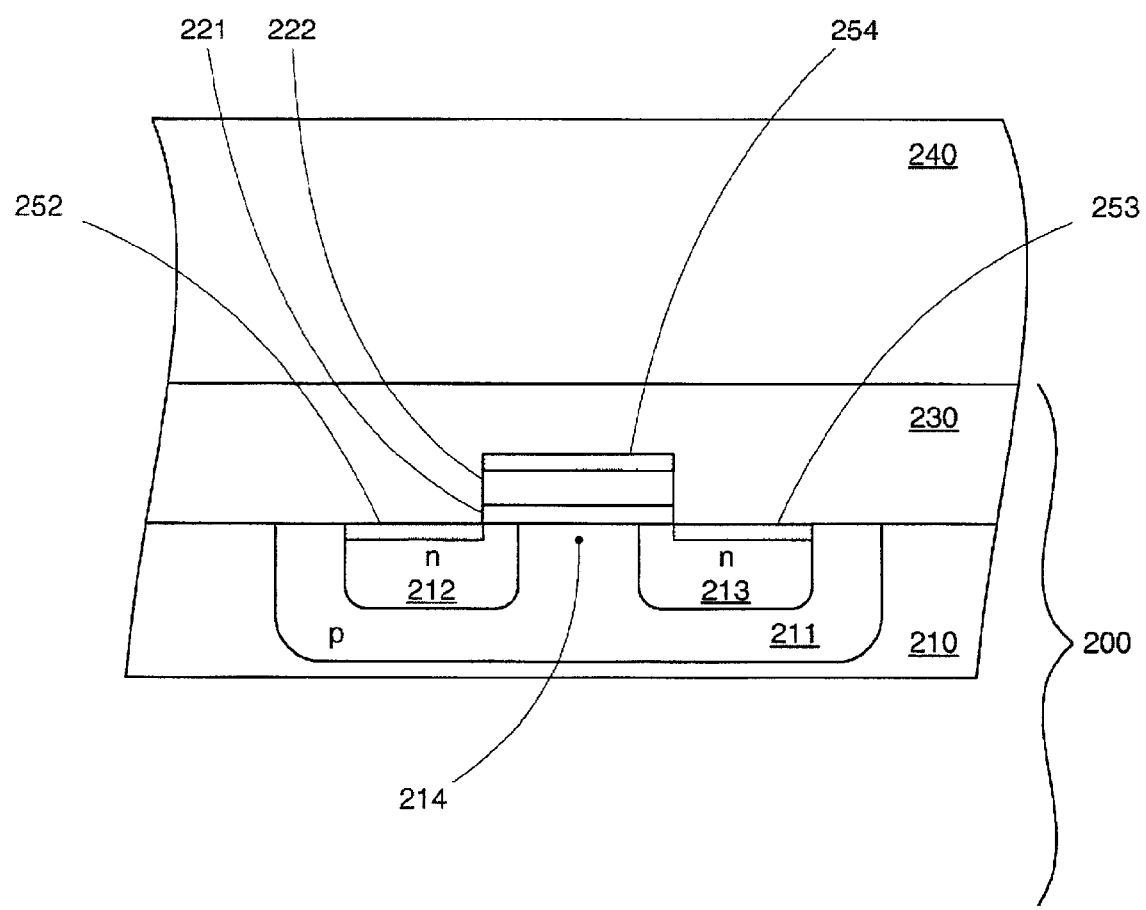
Figure 2D:
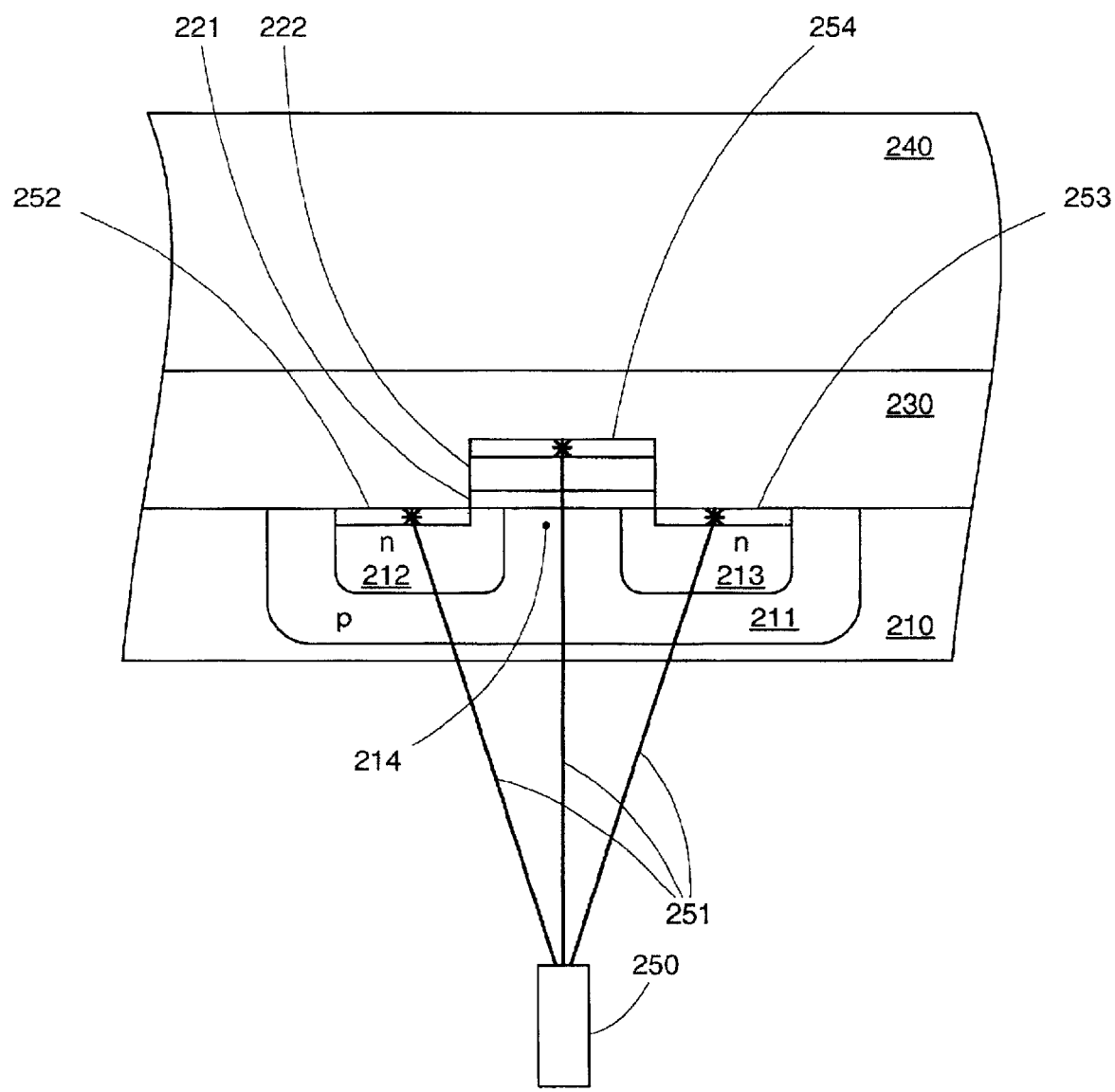

Transistor 201 is programmed in a manner substantially similar to the method described with respect to semiconductor element 101 shown in FIGS. 1a–1e. As shown in FIG. 2b, a support structure 240 is mounted on the top surface of semiconductor structure 200, and, as shown in FIG. 2c, a bulk thinning operation is performed on the backside of semiconductor structure 200. As shown in FIG. 2d, a laser 250 then directs a laser beam 251 at metal silicide layers 252, 253, and 254. Laser beam 251 is configured such that the metal silicide layers of transistor 201 will be substantially opaque to the beam, while substrate 110, gate oxide 121, and polysilicon layer 222 will be substantially transparent. Note that while three laser beams 251 are depicted in FIG. 2d, this is for explanatory purposes only, since a single wide beam would typically be used to simultaneously expose the multiple silicide layers.

Figure 2E:
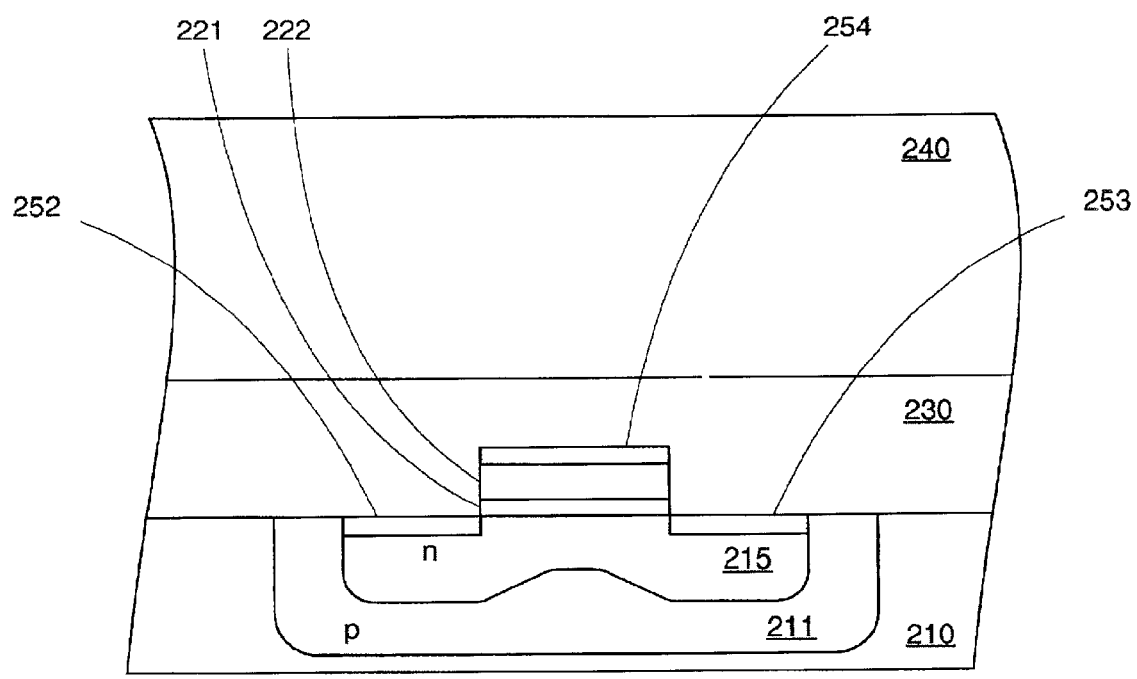

Metal silicide layers 252, 253, and 254 heat up under laser beam 251 and transfer their thermal energy into channel region 214 and the surrounding portions of source 212 and drain 213. As shown in FIG. 2e, diffusion of the dopant atoms in those regions eventually causes n-type source 212 and n-type drain 213 to merge into a single n-type region 215, thereby programming transistor 201. The main difference in programming methodology for metal salicide transistor 201 (versus the programming methodology for metal gate semiconductor element 101 shown in FIGS. 1a–1e) is the simultaneous heating of the source and drain silicide layers along with the gate silicide layer. This allows transistor 201 to absorb a greater amount of laser energy, thereby enabling more rapid heating and efficient programming of salicide transistor 201.

Figure 5A:
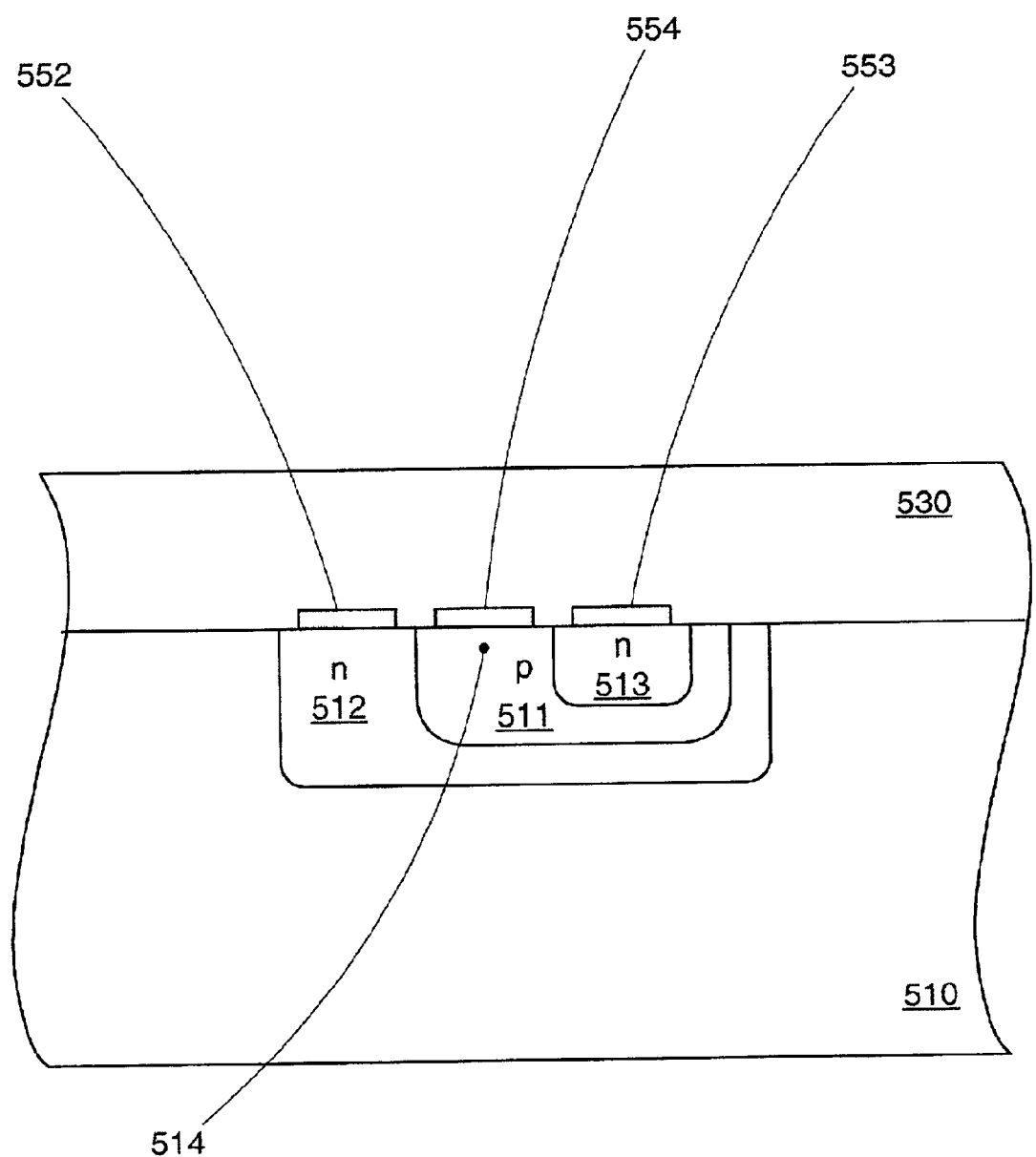
FIGS. 5a–5e show a process for programming a bipolar transistor in accordance with an embodiment of the present invention.

According to another embodiment of the invention, a bipolar element can be programmed via localized heating. FIG. 5a shows a conventional bipolar transistor 501 formed as part of a semiconductor structure 500. Transistor 501 comprises an n-type emitter region 513 formed in a p-type base region 511, which is in turn formed in an n-type collector region 512. Transistor 501 further comprises metal contact pads 552, 553, and 554 formed over regions 512, 513, and 511, respectively, to provide electrical contact to transistor 501. A passivation layer 530 covers transistor 501 to provide environmental protection. Current flow through a depletion region 514 is controlled by the voltage potential across contact pads 554 and 553 (i.e., the base-emitter voltage of transistor 501).

Figure 5B:
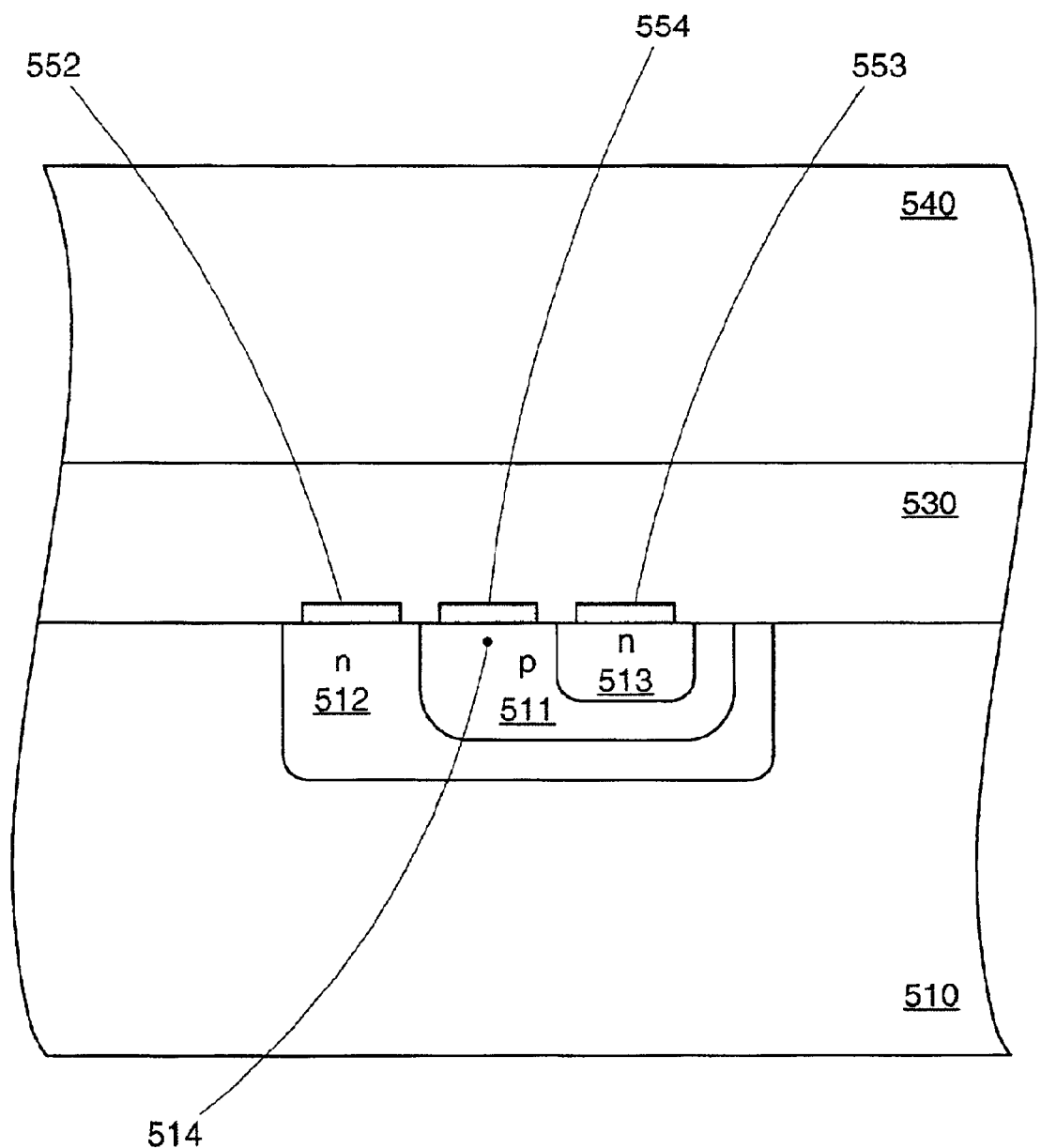
Figure 5C:
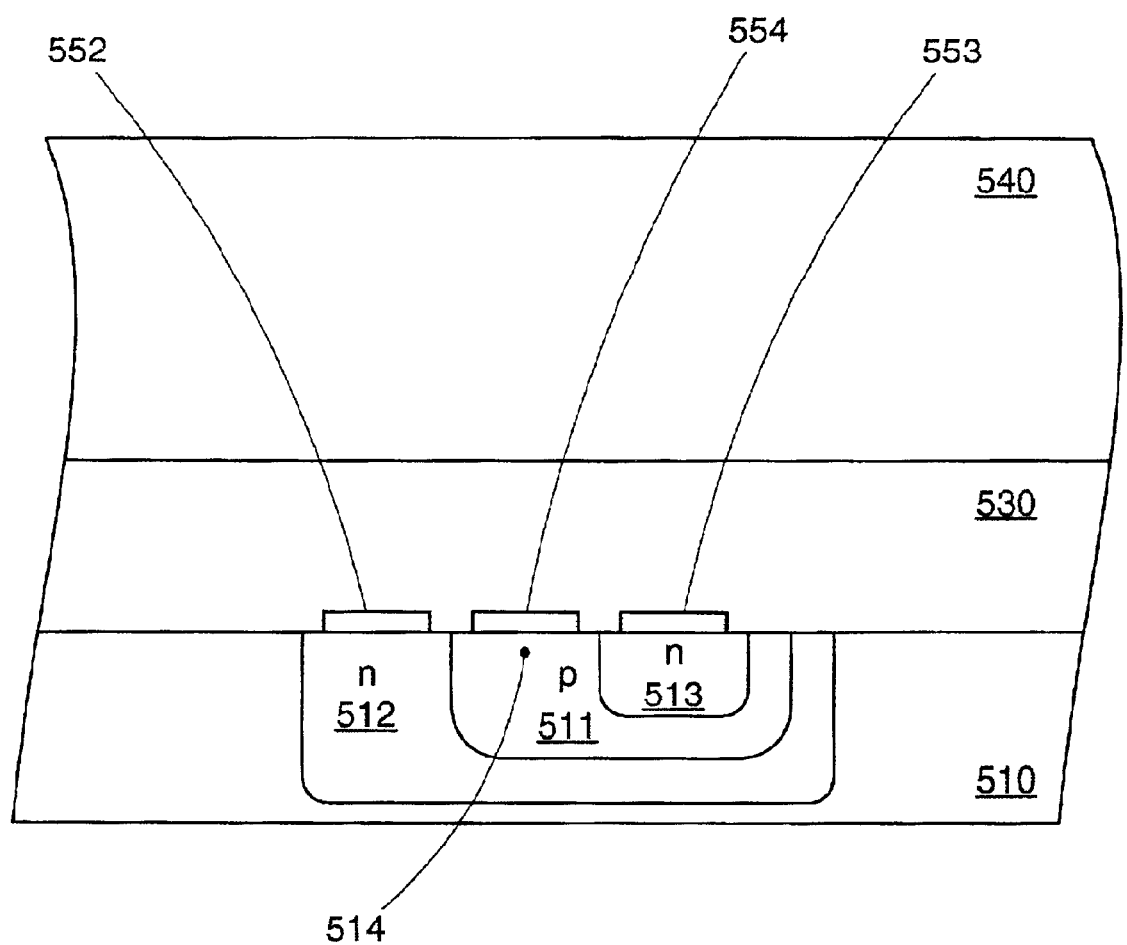
Figure 5D:
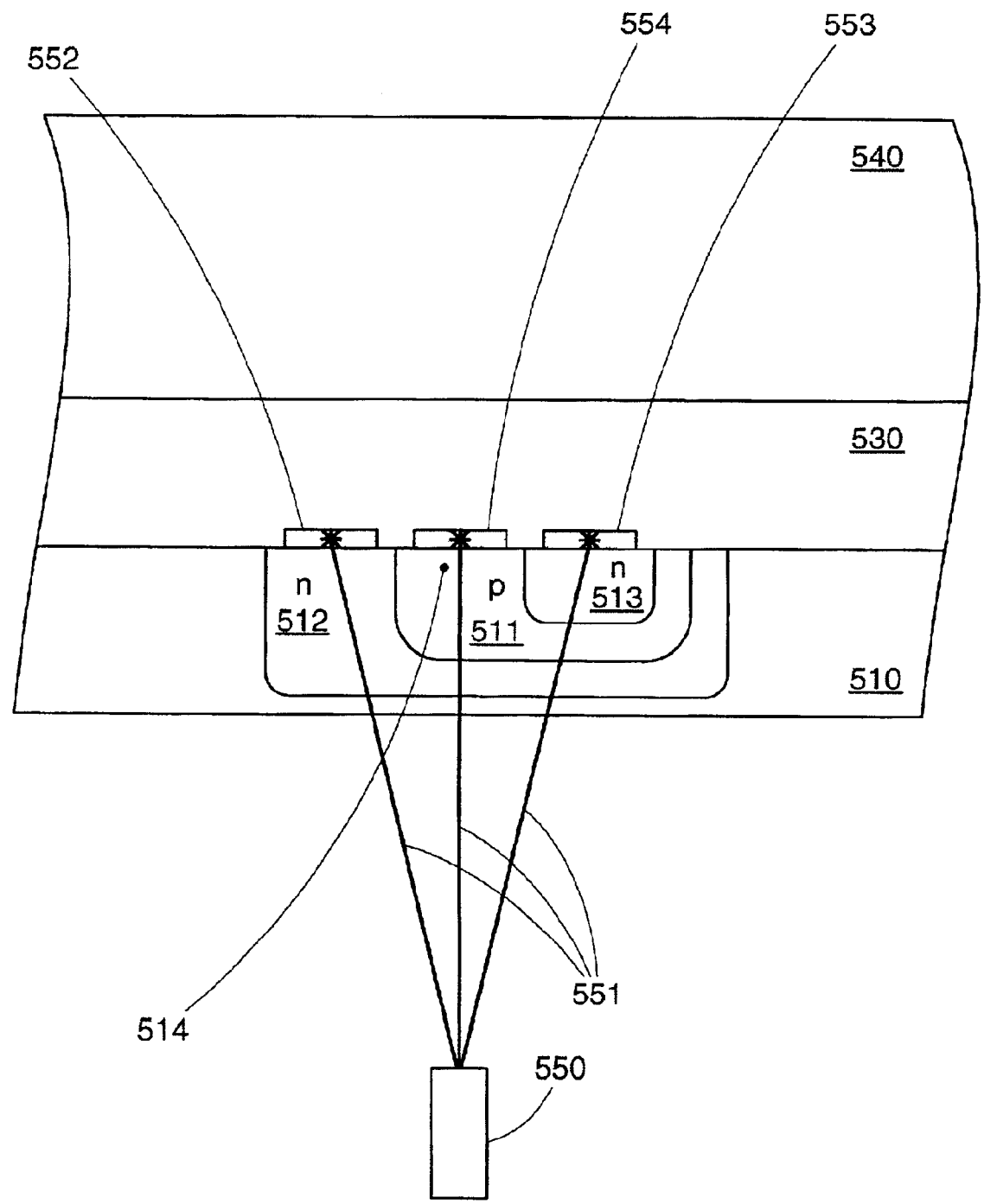

Bipolar transistor 501 is programmed in a manner substantially similar to the method described with respect to metal salicide transistor 201 shown in FIGS. 2a–2e. As shown in FIG. 5b, a support structure 540 is mounted on the top surface of semiconductor structure 500, and as shown in FIG. 5c, a bulk thinning operation is performed on the backside of semiconductor structure 500. As shown in FIG. 5d, a laser 550 then directs a laser beam 551 at metal contact pads 552, 553, and 554. Laser beam 551 is configured such that the metal contact pads of transistor 501 will be substantially opaque to the beam, while substrate 510 and regions 511–513 will be substantially transparent. Note that while three laser beams 251 are depicted in FIG. 5d, this is for explanatory purposes only, since a single wide beam would typically be used to simultaneously expose the multiple contact pads. Note further that the laser beam can be directed at only one of contact pads 552, 553, and 554, although heating is typically enhanced by use of all three contact pads.

Figure 5E:
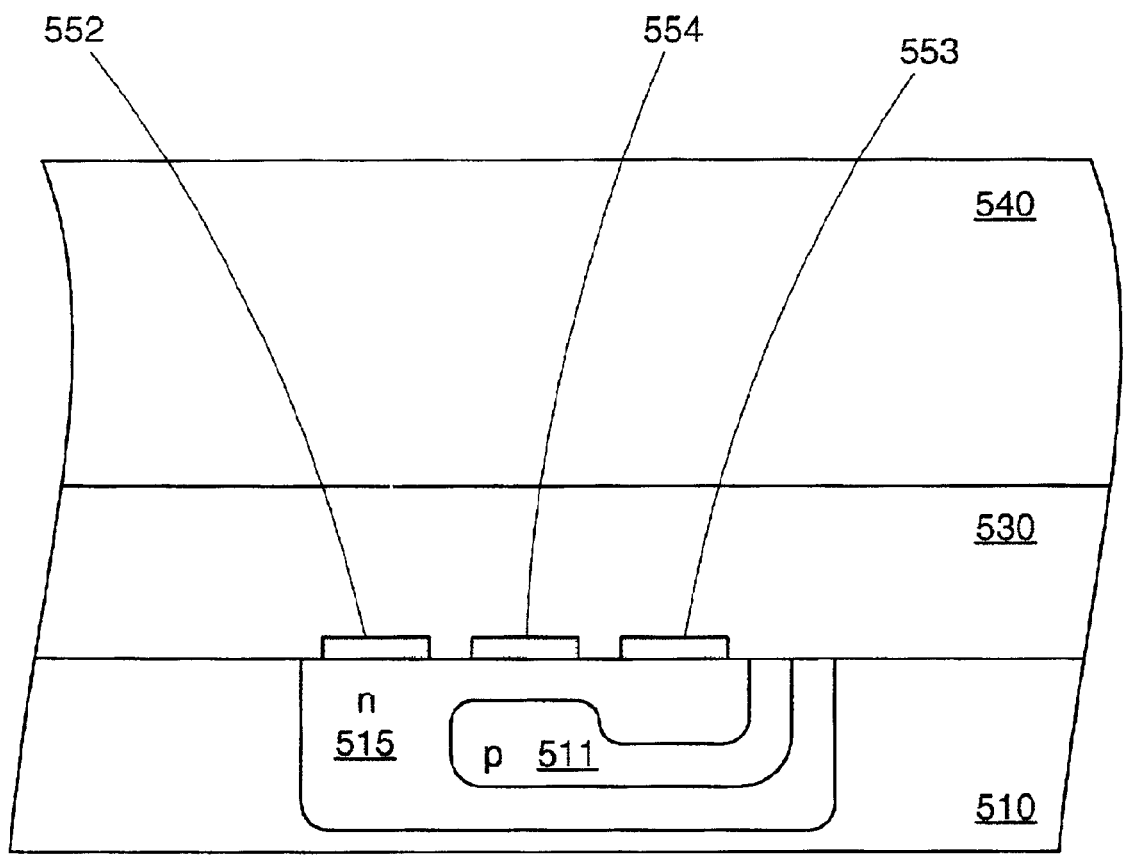

Metal contact pads 552, 553, and 554 heat up under laser beam 551 and transfer their thermal energy into depletion region 514 and the surrounding portions of collector region 512 and emitter region 513. As shown in FIG. 5e, diffusion of the dopant atoms in those regions eventually causes n-type collector region 512 and n-type emitter region 513 to merge into a single n-type region 515, thereby programming transistor 501. Note that a similar technique could be used to program a diode (e.g., the p-n junction formed by p-type base region 511 and n-type emitter region 513).

Figure 3A:
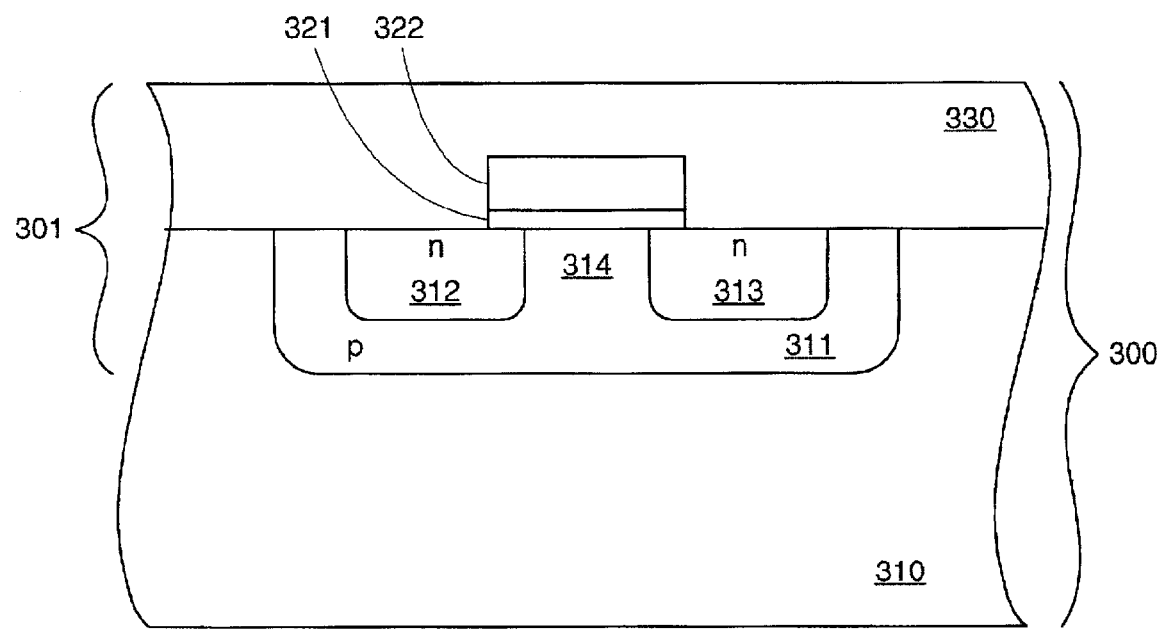
FIGS. 3a–3f show a process for programming a metal gate transistor using a laser beam in accordance with another embodiment of the present invention.
Figure 3B:
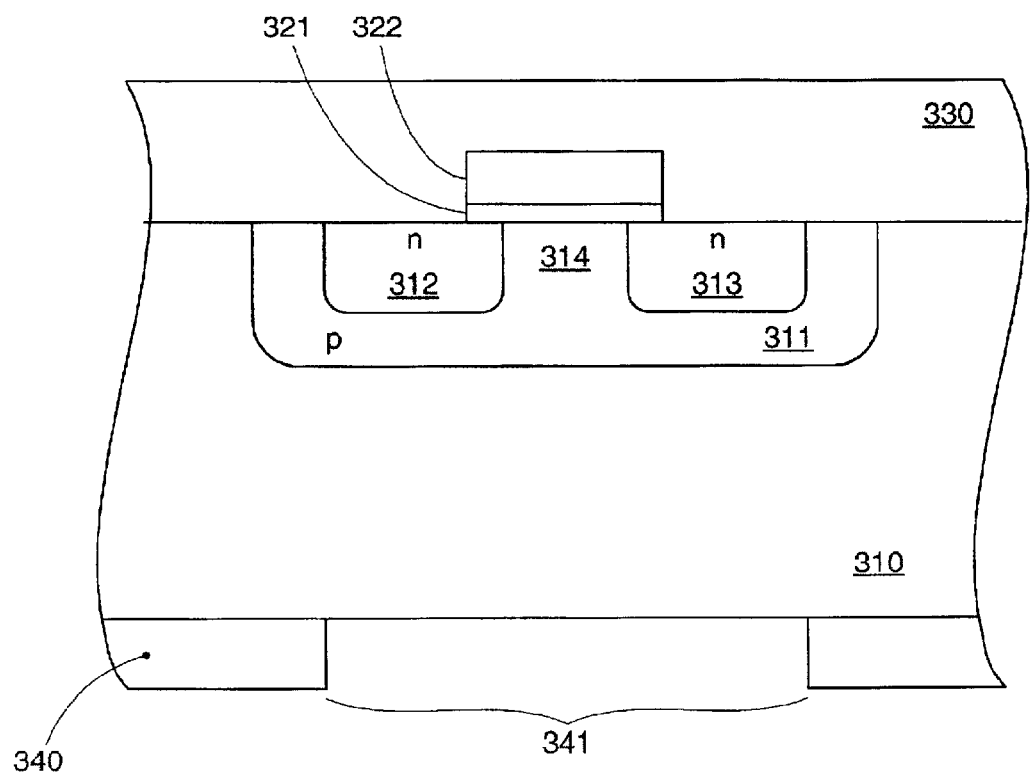

According to another embodiment of the present invention, the need for a support structure is eliminated by reducing support structure thickness at only those locations necessary for programming. Such a technique would also be useful, for example, where the energy beam (laser) used for programming the semiconductor elements would have difficulty penetrating the full substrate thickness. FIG. 3a shows a conventional NMOS transistor 301 formed as part of a processed wafer 300. Transistor 301 is substantially similar to semiconductor element 101 shown in FIG. 1a. As shown in FIG. 3b, to program transistor 301 in accordance with another embodiment of the present invention, a resist layer 340 is formed on the backside of processed wafer 300. Resist layer 340 includes an aperture 341 that exposes a portion of substrate 310 to be thinned. Resist layer 340 can be patterned such that apertures similar to aperture 341 are located at each element to be made available for programming.

Figure 3C:
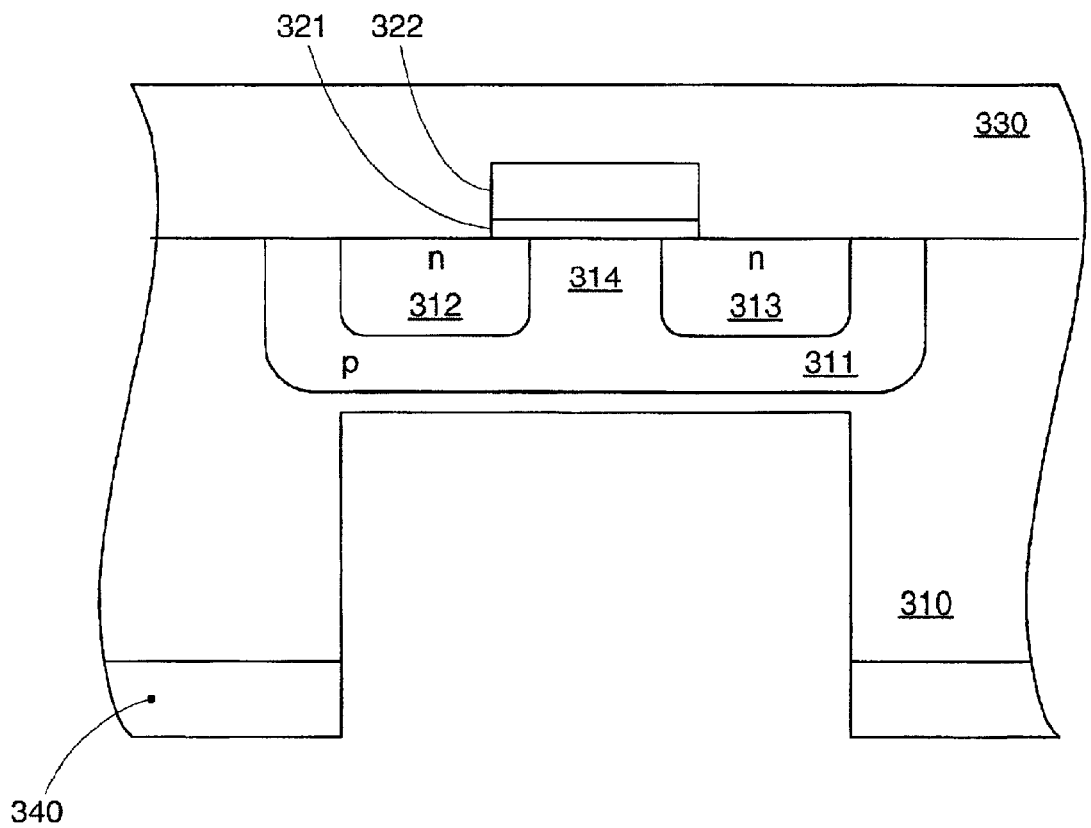
Figure 3D:
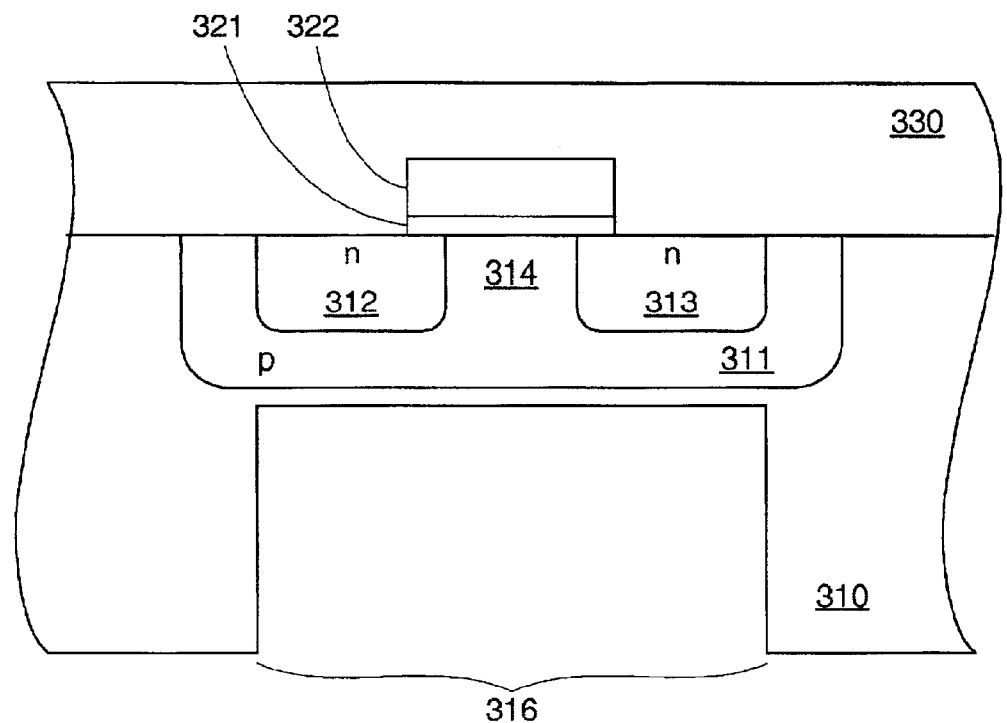

As shown in FIG. 3c, substrate 310 is then etched through aperture 341 until the desired amount of material is removed. While an anisotropic etch process is depicted in FIG. 3c, an isotropic etch process could also be used. As shown in FIG. 3d, resist layer 340 is then stripped from the backside of substrate 310, leaving a pocket 316 directly under transistor 301. The reduced thickness of substrate 310 under channel region 314 minimizes thermal conduction away from that region during programming. Meanwhile, the remaining (unetched) portions of substrate 310 provide structural stability, eliminating the need for structural reinforcement.

Figure 3E:
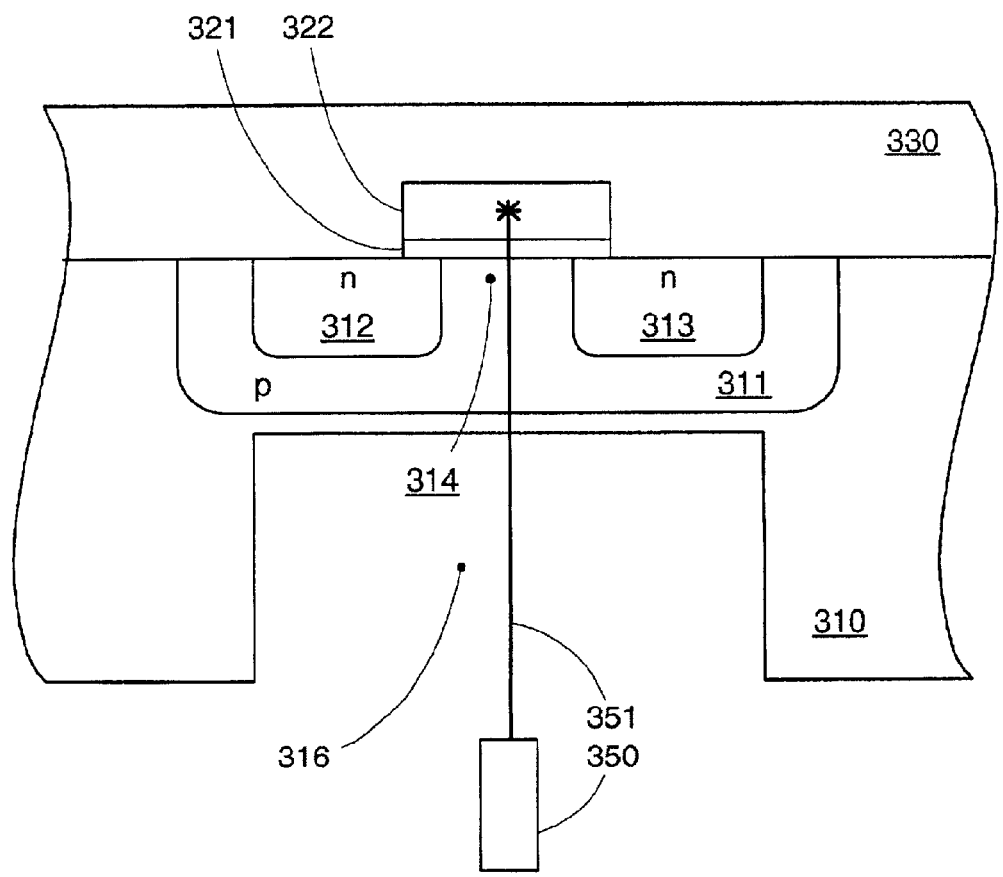
Figure 3F:
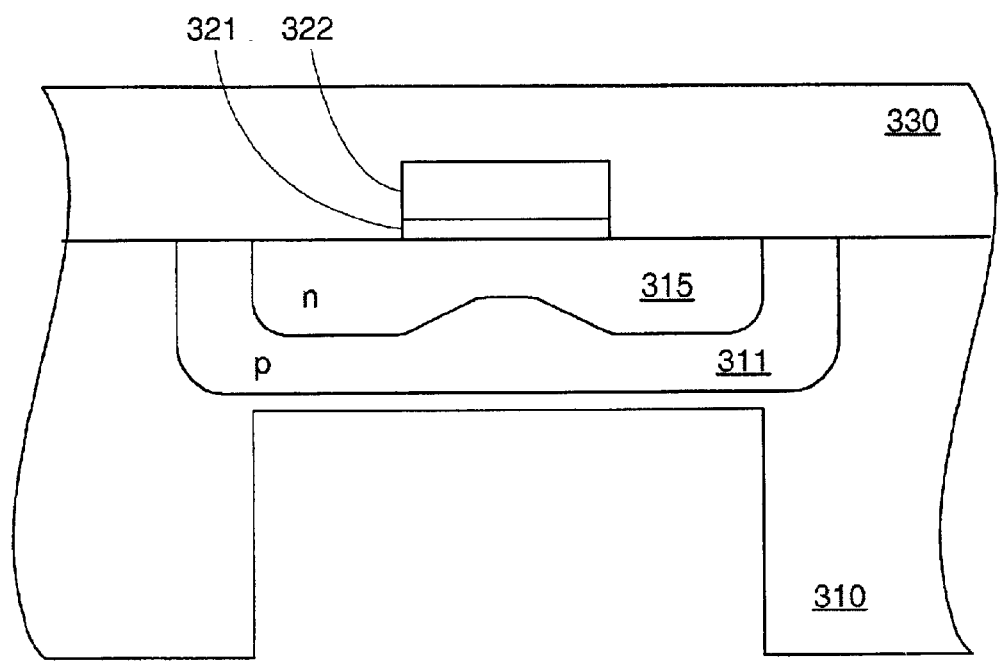

Once substrate 310 has been etched, transistor 301 can be programmed in a manner substantially similar to the method described with respect to FIGS. 1d–1e. A laser 350 directs a laser beam 351 at metal gate 322 through the thinned portion of substrate 310, as shown in FIG. 3e. As described previously with respect to FIG. 1d, laser 350 is configured to produce a laser beam (laser beam 351) that is transmitted through substrate 310 and gate oxide 321 and is absorbed by metal gate 322. Metal gate 322 heats up and raises the temperature of channel region 314 and the surrounding portions of source 312 and drain 313. Heat transfer away from the doped regions is minimized by the reduced thickness of substrate 310 at pocket 316. As shown in FIG. 3f, the resulting diffusion of dopant atoms leads to the formation of a single n-type region 315, thereby programming transistor 301.

Figure 4A:
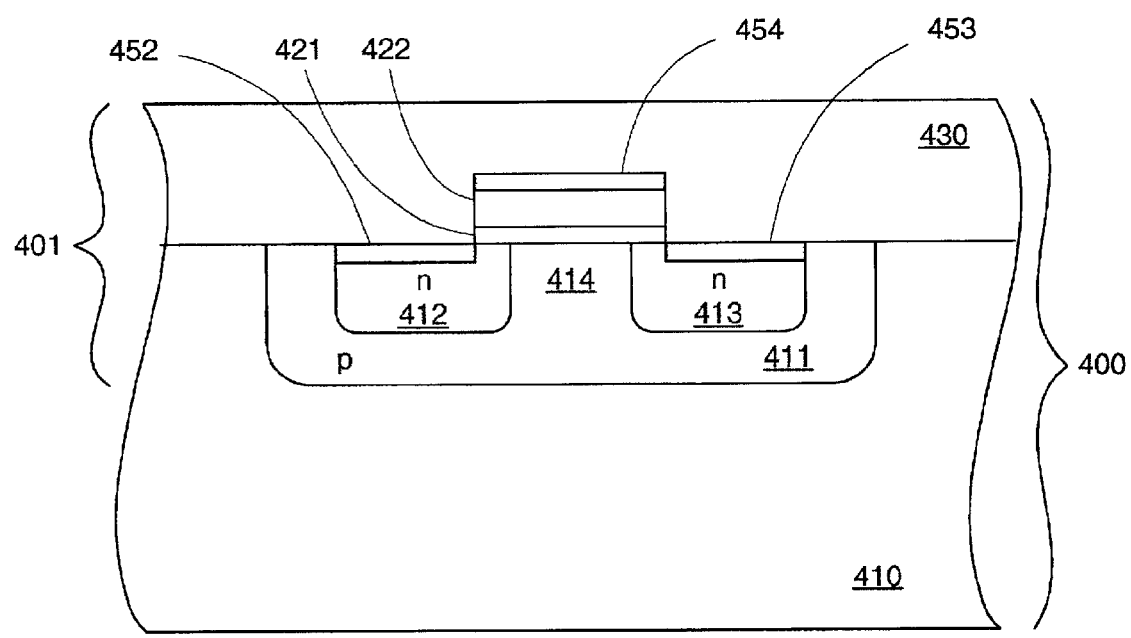
FIGS. 4a–4f show a process for programming a metal salicide transistor using a laser beam in accordance with another embodiment of the present invention.

According to another embodiment of the present invention, laser heating and programming efficiency can again be improved by using a metal salicide transistor. FIG. 4a shows a conventional metal salicide transistor 401 formed as part of a processed wafer 400. Transistor 401 is substantially similar to semiconductor element 201 shown in FIG. 2a, and is programmed in a manner substantially similar to that described with respect to FIGS. 3a–3f.

Figure 4B:
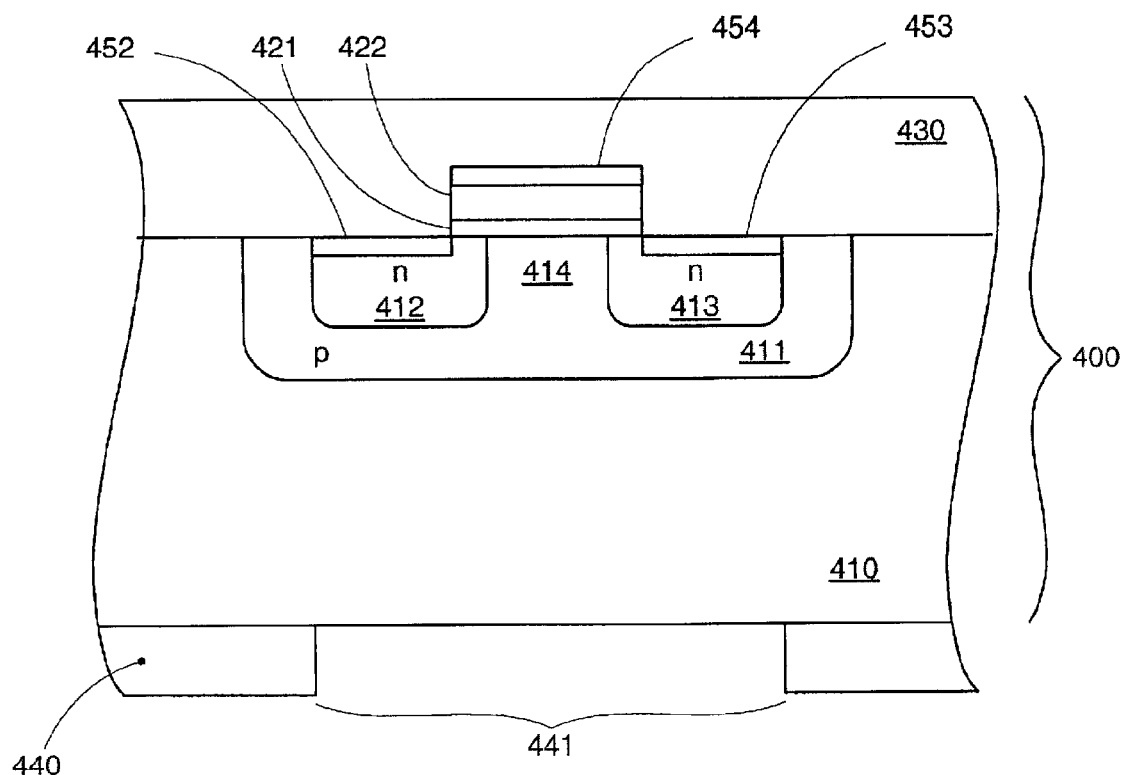
Figure 4C:
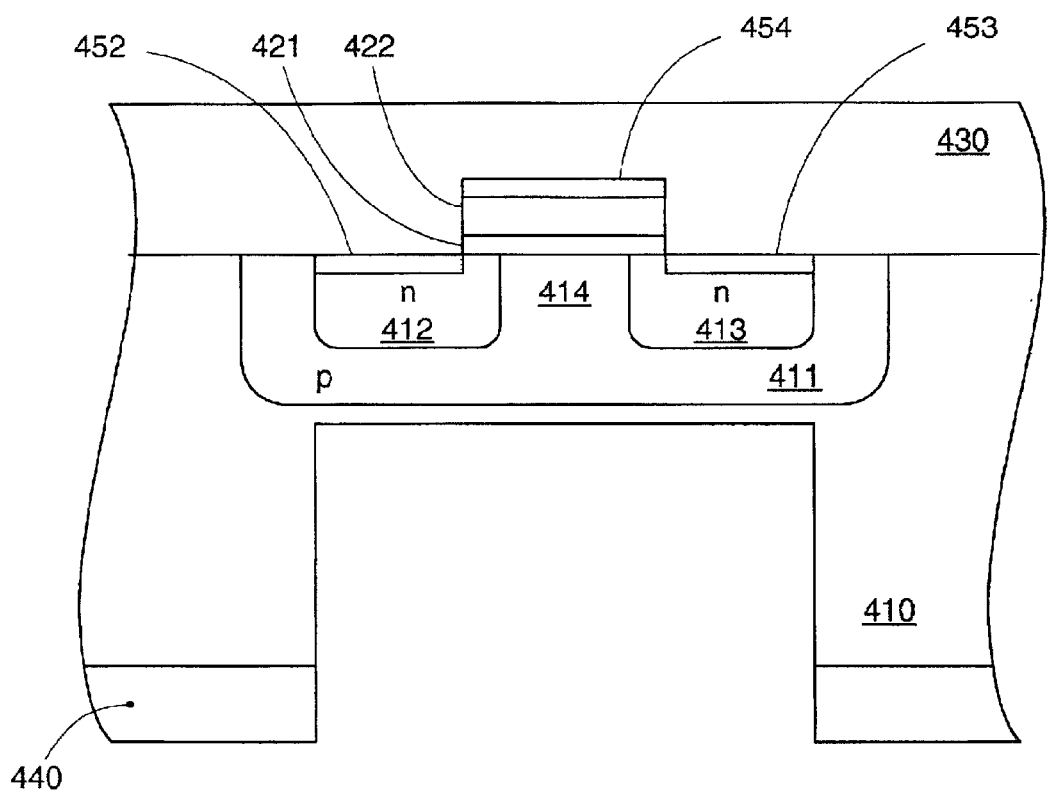
Figure 4D:
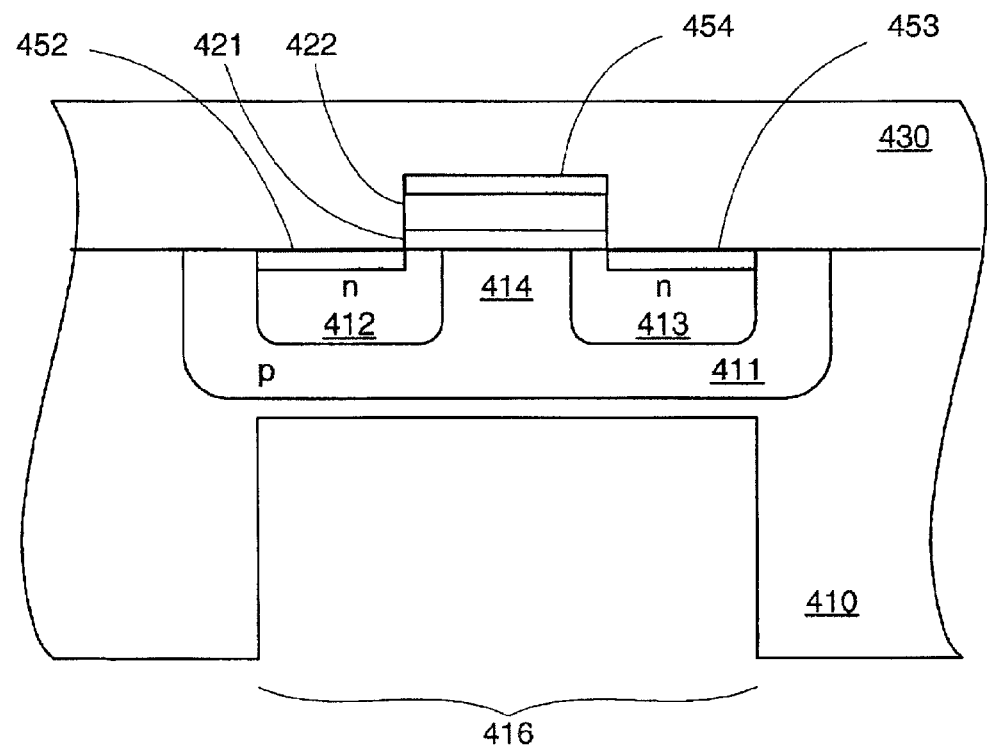
Figure 4E:
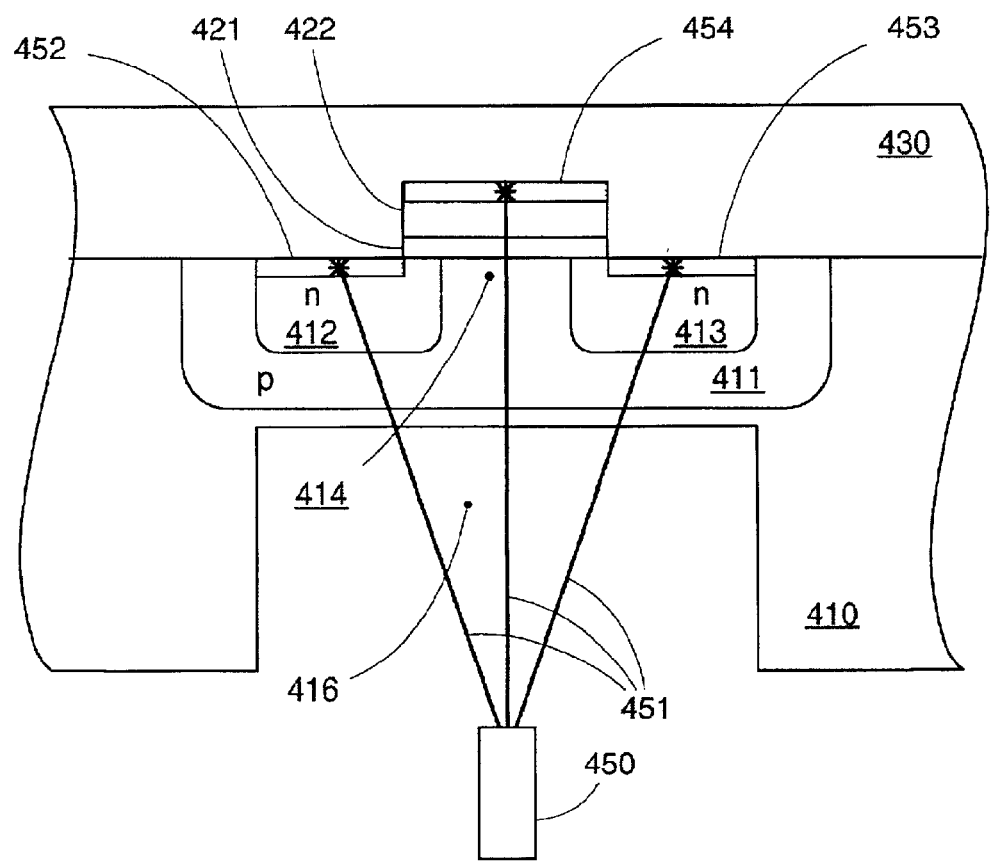
Figure 4F:
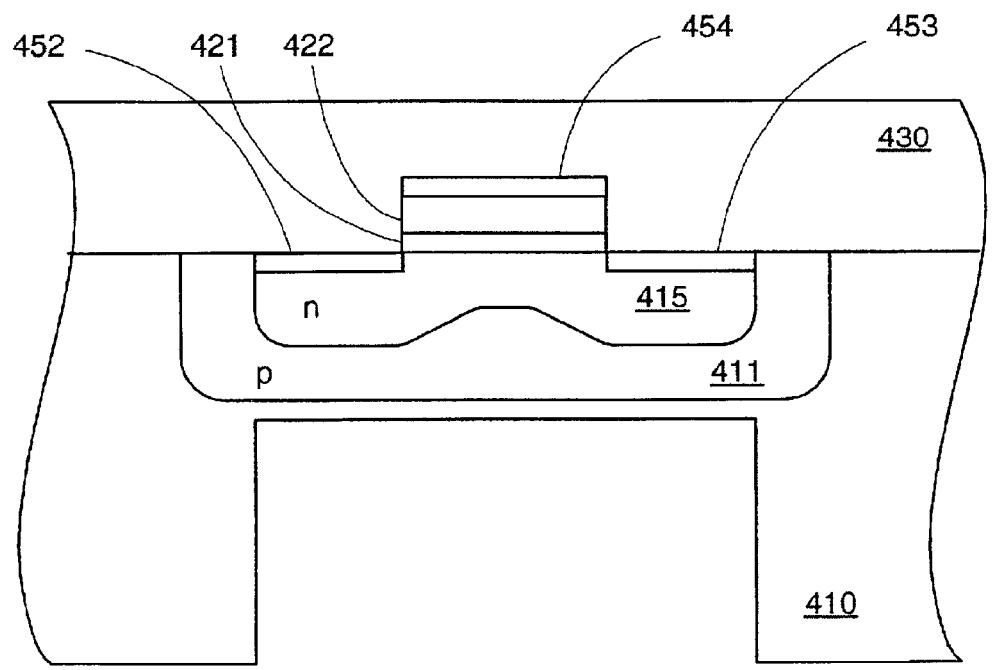

To program transistor 401 in accordance with an embodiment of the invention, a resist layer 440 with an aperture 441 is formed on the backside of processed wafer 400, as shown in FIG. 4b. Substrate 410 is then etched through aperture 441 until the desired amount of material is removed, as shown in FIG. 4c. When resist layer 440 is stripped, a pocket 416 is left directly under transistor 401, as shown in FIG. 4d. A laser 450 then directs a laser beam 451 at silicide layers 452, 453, and 454 through the thinned portion of substrate 410, as shown in FIG. 4e. Silicide layers 452, 453, and 454 raise the temperatures of the surrounding portions of source 412, drain 413, and channel region 414. The resulting diffusion of dopant atoms leads to the formation of a single n-type region 415, as shown in FIG. 4f, thereby programming transistor 401.

Figure 6A:
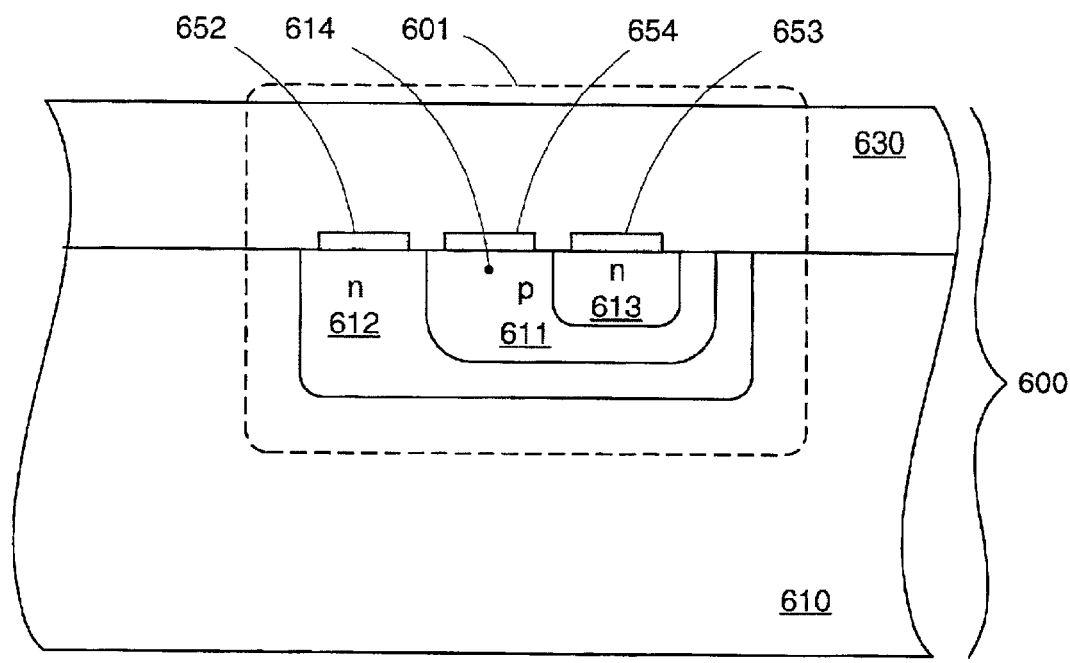
FIGS. 6a–6f show a process for programming a bipolar transistor in accordance with another embodiment of the present invention.

According to another embodiment of the present invention, a bipolar element can be programmed using this backside thinning technique. FIG. 6a shows a conventional bipolar transistor 601 formed as part of a processed wafer 600. Transistor 601 is substantially similar to semiconductor element 501 shown in FIG. 5a, and is programmed in a manner substantially similar to that described with respect to FIGS. 4a–4f.

Figure 6B:
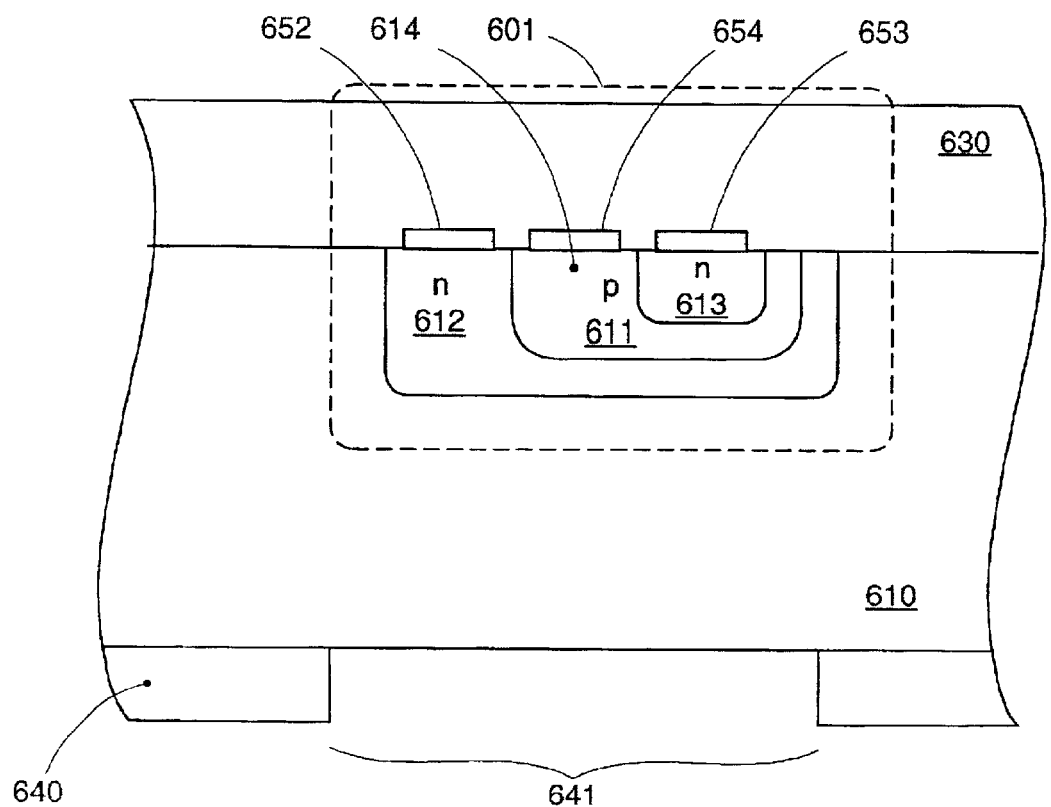
Figure 6C:
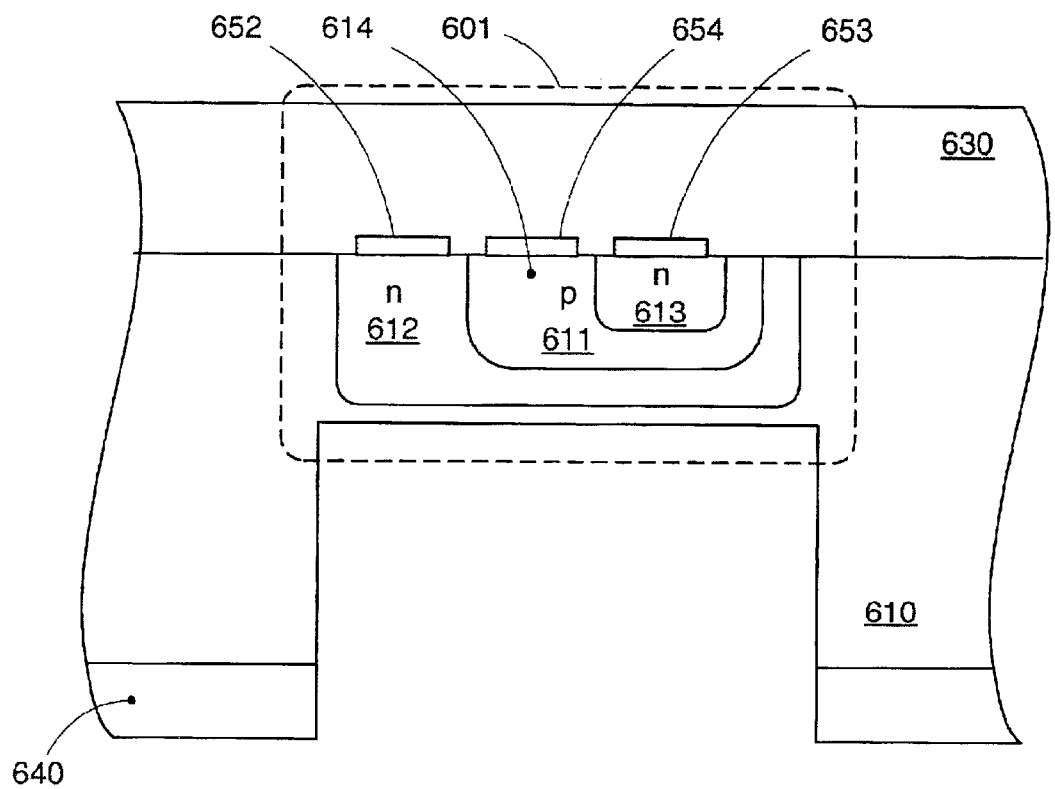
Figure 6D:
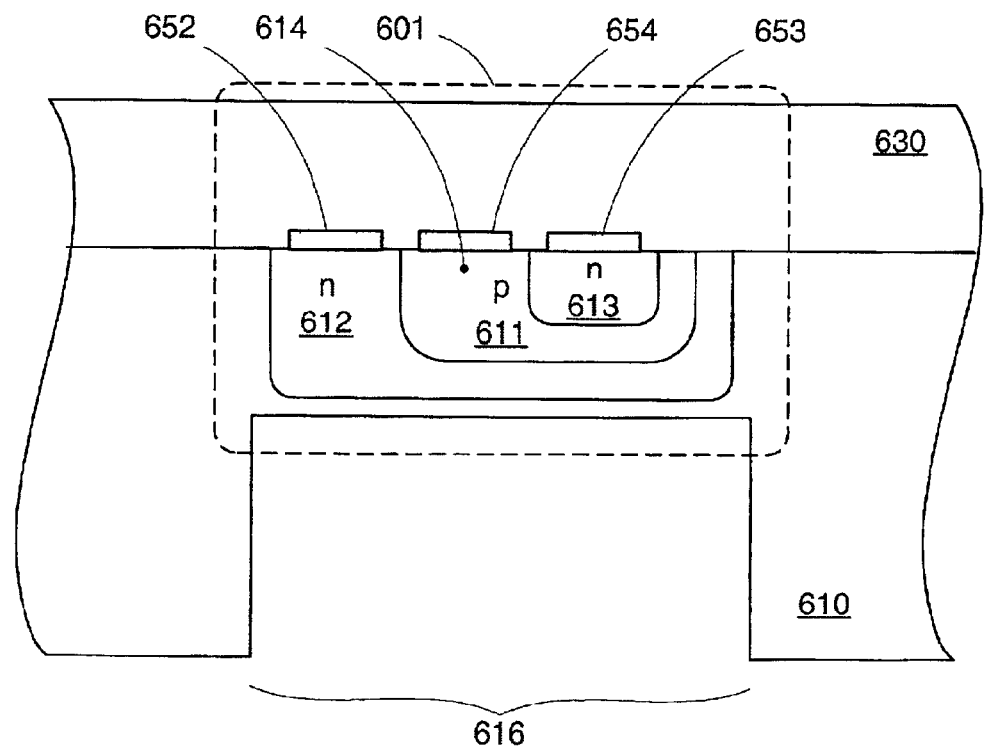
Figure 6E:
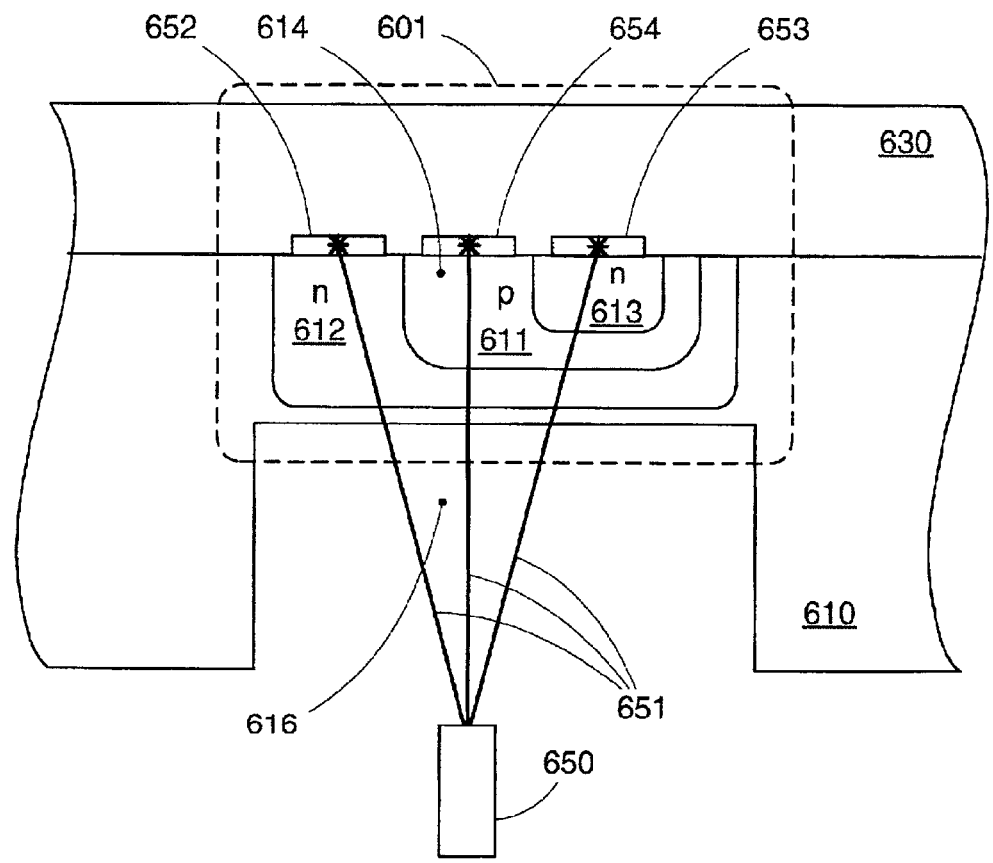

To program transistor 601 in accordance with an embodiment of the invention, a resist layer 640 with an aperture 641 is formed on the backside of processed wafer 600, as shown in FIG. 6b. As shown in FIG. 6c, substrate 610 is then etched through aperture 641 until the desired amount of material is removed. As shown in FIG. 6d, when resist layer 640 is stripped, a pocket 616 is left directly under transistor 601. As shown in FIG. 6e, a laser 650 then directs a laser beam 651 at contact pads 652, 653, and 654 through the thinned portion of substrate 610.

Figure 6F:
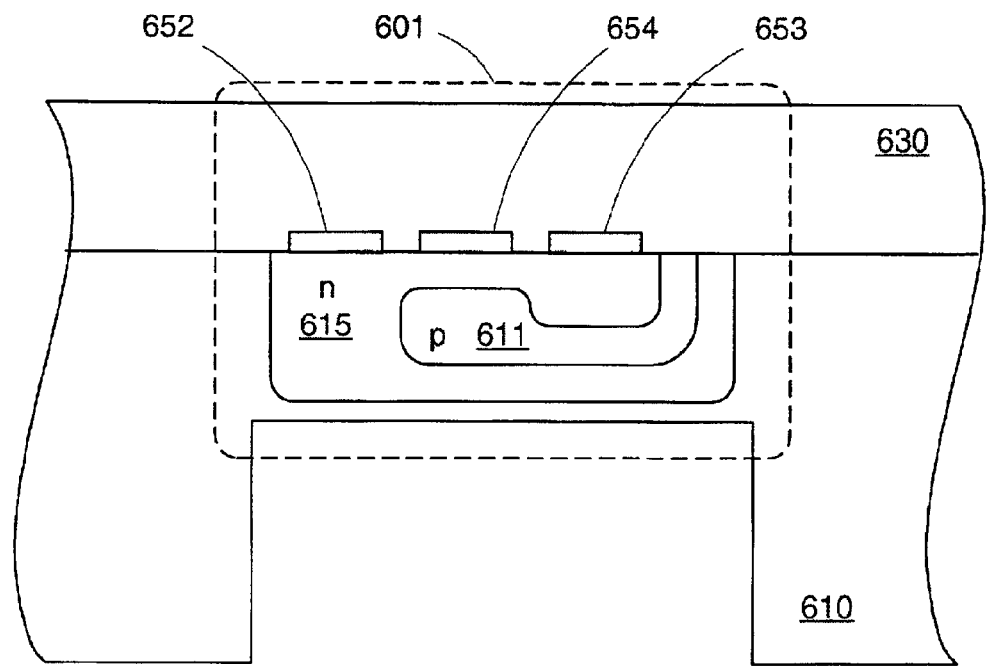

Contact pads 652, 653, and 654 raise the temperatures of the depletion region 614 and the surrounding portions of collector region 612 and emitter region 613. As shown in FIG. 6f, the resulting diffusion of dopant atoms leads to the formation of a single n-type region 615, thereby programming transistor 601. Note that a similar technique could be used to program a diode (e.g., the p-n junction formed by p-type base region 611 and n-type emitter region 613).

Thus, a method for programming an integrated circuit using backside laser application has been described. Although the invention has been described in connection with several embodiments, it is understood that this invention is not limited to the embodiments disclosed, but is capable of various modifications, which would be apparent to a person skilled in the art. For example, substrates 101, 201, 301, 401, 501, and 601 can comprise silicon, gallium arsenide, or any other suitable semiconductor material. Also, while the invention has been described with respect to NMOS and NPN transistors, the invention is equally applicable to PMOS and PNP transistors, along with other semiconductor elements, including diodes and resistors. Furthermore, while the programming operation has been described with respect to metal-gate transistors, the present invention can be applied to any element having an "opaque" element; i.e., a element component that can absorb an energy beam that is transmitted (i.e., not absorbed) by the surrounding material). Thus, the invention is limited only by the following claims.

What is claimed is:

1. A method for altering the semiconductor characteristics of a semiconductor element formed on a substrate, the method comprising:
    directing an energy beam at the semiconductor element, wherein the energy beam is substantially absorbed by a first portion of the semiconductor element;
    thinning the substrate under the semiconductor element; and
    the step of directing an energy beam at the semiconductor element including directing the energy beam at the first portion of the semiconductor element through the substrate, wherein the energy beam is substantially transmitted through the substrate;
    wherein the semiconductor element comprises:
        a source region;
        a drain region;
        a channel region between the source region and the drain region;
        a gate oxide formed over the channel region; and
        a gate formed over the gate oxide, wherein the first portion of the semiconductor element comprises the gate and wherein the energy beam is substantially transmitted through the channel region; and
    wherein the energy beam causes the source region and the drain region to merge so as to form an always-on current path in the semiconductor element.

2. The method of claim 1, wherein the energy beam is produced by a $CO_2$ laser.

3. The method of claim 1, wherein the energy beam is produced by a YAG laser.

4. The method of claim 3, wherein the energy beam has a wavelength of greater than 1.2 $\mu$m.

5. The method of claim 1, wherein the energy beam is produced by a laser ablation system for repairing defects in photomasks.

6. The method of claim 1, further comprising:
    forming a passivation layer over the semiconductor element on the substrate, and
    mounting a support structure on the passivation layer.

7. The method of claim 6, wherein the support structure comprises an unprocessed wafer having an oxide layer, and wherein mounting the support structure comprises covalently bonding the oxide layer of the unprocessed wafer to the passivation layer.

8. The method of claim 6, wherein the support structure comprises a processed wafer having an oxide layer, and wherein mounting the support structure comprises covalently bonding the oxide layer of the processed wafer to the passivation layer.

9. The method of claim 6, wherein mounting the support structure comprises using an adhesive to attach the support structure to the passivation layer.

10. The method of claim 6, wherein thinning the backside of the processed wafer comprises a grinding operation.

11. The method of claim 6, wherein thinning the backside of the processed wafer comprises a chemical-mechanical polishing (CMP) operation.

12. The method of claim 6, wherein thinning the backside of the processed wafer comprises an etch process.

13. The method of claim 1, wherein thinning the backside of the processed wafer comprises:
    forming a resist layer on the backside of the processed wafer, the resist layer comprising an aperture under the transistor; and
    etching the processed wafer through the aperture.

14. The method of claim 13, wherein etching the processed wafer comprises performing an anisotropic etch process.

15. The method of claim 13, wherein etching the processed wafer comprises performing an isotropic etch process.

16. The method of claim 1, wherein the substrate comprises a silicon wafer.

17. The method of claim 1, wherein the substrate comprises a gallium arsenide wafer.

18. The method of claim 1, wherein the substrate comprises an insulating plate.

19. The method of claim 1, wherein the substrate comprises an amorphous silicon layer.

20. The method of claim 1, wherein the gate comprises a metal layer.

21. The method of claim 1, wherein the gate comprises a first silicide layer.

22. The method of claim 21, wherein the source region comprises a second silicide layer, and wherein the drain comprises a third suicide layer, the first, second, and third silicide layers being formed using a salicide process, wherein the first portion of the semiconductor element comprises the second and third silicide layers.

23. The method of claim 22, wherein the first, second, and third silicide layers comprise titanium silicide.

* * * * *